US012761406B2

(12) United States Patent
Kim et al.

(10) Patent No.: US 12,761,406 B2
(45) Date of Patent: Oct. 13, 2026

(54) OPTICAL MEMBER HAVING A PLURALITY OF LAYERS WITH DIFFERENT REFRACTIVE INDICES AND DISPLAY APPARATUS COMPRISING THE SAME

(71) Applicant: LG Display Co., Ltd., Seoul (KR)

(72) Inventors: SunWoong Kim, Paju-si (KR); JuHun Min, Paju-si (KR); SeungSoo Yang, Paju-si (KR); ChangHee Choi, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 454 days.

(21) Appl. No.: 18/238,342

(22) Filed: Aug. 25, 2023

(65) Prior Publication Data

US 2024/0210604 A1 Jun. 27, 2024

(30) Foreign Application Priority Data

Dec. 27, 2022 (KR) ........................ 10-2022-0185343

(51) Int. Cl.

| | |
|---|---|
| ***G02B 5/02*** | (2006.01) |
| ***G02B 1/04*** | (2006.01) |
| ***H10K 59/12*** | (2023.01) |
| ***H10K 59/38*** | (2023.01) |
| ***H10K 59/80*** | (2023.01) |

(52) U.S. Cl.

CPC ............. *G02B 5/0205* (2013.01); *G02B 1/04* (2013.01); *G02B 5/0278* (2013.01); *H10K 59/38* (2023.02); *H10K 59/879* (2023.02); *H10K 59/12* (2023.02)

(58) Field of Classification Search

CPC .... H10K 59/879; H10K 59/12; H10K 59/877; H10K 50/86

See application file for complete search history.

(56) References Cited

U.S. PATENT DOCUMENTS

| | | | | |
|---|---|---|---|---|
| 2016/0315287 | A1* | 10/2016 | Heo | H10K 59/877 |
| 2018/0247980 | A1* | 8/2018 | Jang | H10K 59/124 |

(Continued)

FOREIGN PATENT DOCUMENTS

| | | | |
|---|---|---|---|
| JP | 7057487 | B2 * | 4/2022 |
| KR | 10-2009-0123305 | A | 12/2009 |
| KR | 10-2021-0038149 | A | 4/2021 |

OTHER PUBLICATIONS

Adv Funct Materials—2019—Salehi—Recent Advances in OLED Optical Design (Year: 2019).*

(Continued)

*Primary Examiner* — Tracie Y Green
(74) *Attorney, Agent, or Firm* — Birch, Stewart, Kolasch & Birch, LLP

(57) ABSTRACT

An optical member capable of improving a vision recognition rate of a mark used for alignment such as bonding alignment, and a display apparatus including the same are discussed. The optical member can include a first layer having a pattern portion, and a second layer covering the pattern portion. At least one of the first layer or the second layer has a refractive index that is varied depending on different wavelength areas, where the wavelength areas include a visible ray area and an infrared area having a wavelength longer than that of the visible ray area. A difference in a refractive index between the first layer and the second layer is greater in the visible ray area than the infrared area.

18 Claims, 8 Drawing Sheets

I-I'

(56) References Cited

U.S. PATENT DOCUMENTS

| | | | | |
|---|---|---|---|---|
| 2018/0267358 | A1* | 9/2018 | Choi | G02F 1/133528 |
| 2019/0067381 | A1* | 2/2019 | Kim | H10K 59/80515 |
| 2024/0008348 | A1* | 1/2024 | Kim | H10K 59/879 |

OTHER PUBLICATIONS

Ishito et al., JP7057487B2, Machine Translation, Apr. 2022 (Year: 2022).*

* cited by examiner

OPTICAL MEMBER HAVING A PLURALITY OF LAYERS WITH DIFFERENT REFRACTIVE INDICES AND DISPLAY APPARATUS COMPRISING THE SAME

CROSS-REFERENCE TO RELATED APPLICATIONS

This application claims priority to Korean Patent Application No. 10-2022-0185343 filed in the Republic of Korea on Dec. 27, 2022, the entire contents of which is hereby expressly incorporated by reference into the present application.

BACKGROUND

Field

The present disclosure relates to an optical member for displaying an image and a display apparatus comprising the same.

Discussion of the Related Art

Among display apparatuses, an organic light emitting display apparatus has a high response speed, good viewing angle and low power consumption. Further, the organic light emitting display apparatus self-emits light without requiring a separate light source in contrast to a liquid crystal display apparatus. Thus the organic light emitting display apparatus has received attention as a next-generation flat panel display apparatus.

The organic light emitting display apparatus displays an image through light emission of a light emitting element layer having a light emitting layer interposed between two electrodes. The organic light emitting display apparatus can be fabricated by bonding of a lower substrate and an upper substrate, in which the light emitting element layer is provided.

Meanwhile, studies for increasing light extraction efficiency and reducing reflectance due to external light in the organic light emitting display apparatus are ongoing. However, there can be a limitation in improvement due to an alignment defect which can occur during the bonding of the lower substrate and the upper substrate.

SUMMARY OF THE DISCLOSURE

The present disclosure has been made in view of the above limitations and other disadvantages associated with the related art.

It is an object of the present disclosure to provide an optical member capable of improving a vision recognition rate of a mark used for alignment such as bonding alignment, and a display apparatus comprising the same.

It is another object of the present disclosure to provide an optical member capable of reducing an alignment defect/issue of a lower substrate and an upper substrate and a display apparatus comprising the same.

It is still another object of the present disclosure to provide an optical member capable of performing a repair process of a defective pixel and a display apparatus comprising the same.

It is further still another object of the present disclosure to provide an optical member capable of reducing reflectance of external light and a display apparatus comprising the same.

It is further still another object of the present disclosure to provide an optical member capable of improving light extraction efficiency of light emitted from a light emitting element layer and a display apparatus comprising the same.

It is further still another object of the present disclosure to provide a display apparatus capable of reducing power consumption through light extraction.

It is further still another object of the present disclosure is to provide an optical member that can minimize or reduce occurrence of a radial rainbow pattern and a radial circular ring pattern based on a diffraction pattern of reflective light generated by destructive interference and/or constructive interference of light, which can be caused by reflection of external light, and to provide a display apparatus comprising such optical member.

It is further still another object of the present disclosure is to provide an optical member capable of reducing degradation of black visibility characteristics, which can be caused by reflection of external light, and to provide a display apparatus comprising such optical member.

In addition to the objects of the present disclosure as mentioned above, additional objects and features of the present disclosure will be clearly understood by those skilled in the art from the following description of the present disclosure.

In accordance with an aspect of the present disclosure, the above and other objects can be accomplished by the provision of an optical member comprising a first layer including a pattern portion, and a second layer covering the pattern portion, wherein at least one of the first layer or the second layer has a refractive index varied depending on different wavelength areas, the wavelength areas include a visible ray area and an infrared area having a wavelength longer than that of the visible ray area, and a difference in a refractive index between the first layer and the second layer is greater in the visible ray area than the infrared area.

In accordance with another aspect of the present disclosure, the above and other objects can be accomplished by the provision of a display apparatus comprising a display panel for displaying an image, and an optical panel coupled to the display panel, wherein the optical panel includes an optical member, and the optical member includes a first layer including a pattern portion, and a second layer covering the pattern portion, at least one of the first layer or the second layer has a refractive index varied depending on different wavelength areas, the wavelength areas include a visible ray area and an infrared area having a wavelength longer than that of the visible ray area, and a difference in a refractive index between the first layer and the second layer is greater in the visible ray area than the infrared area.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION OF THE EMBODIMENTS

Figure 1:
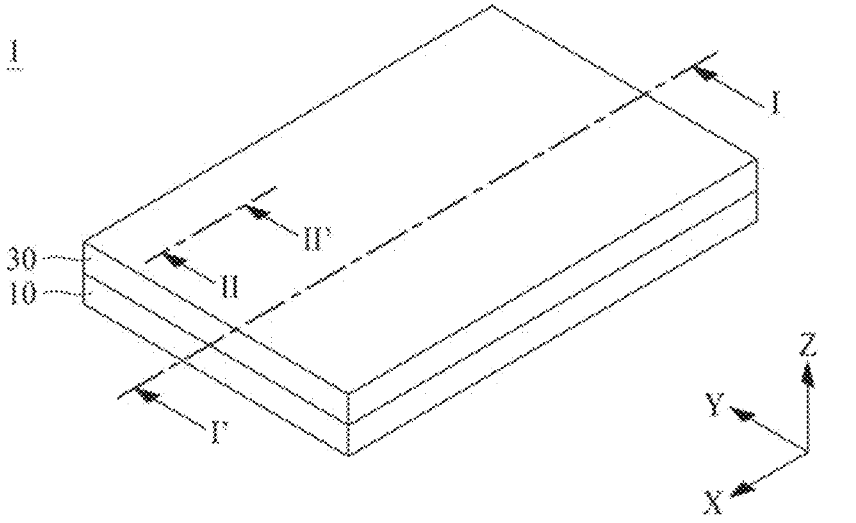
FIG. 1 is a schematic perspective view illustrating a display apparatus according to one embodiment of the present disclosure.

Reference will now be made in detail to the embodiments of the present disclosure, examples of which are illustrated in the accompanying drawings.

Wherever possible, the same reference numbers will be used throughout the drawings to refer to the same or like parts.

Advantages and features of the present disclosure, and implementation methods thereof will be clarified through following embodiments described with reference to the accompanying drawings.

The present disclosure may, however, be embodied in different forms and should not be construed as limited to the embodiments set forth herein.

Rather, these embodiments are provided so that this disclosure will be thorough and complete, and will fully convey the scope of the present disclosure to those skilled in the art.

A shape, a size, a ratio, an angle, and a number disclosed in the drawings for describing embodiments of the present disclosure are merely an example, and thus, the present disclosure is not limited to the illustrated details.

Like reference numerals refer to like elements throughout. In the following description, when the detailed description of the relevant known function or configuration is determined to unnecessarily obscure the important point of the present disclosure, the detailed description will be omitted.

In a case where 'comprise,' 'have,' and 'include' described in the present specification are used, another part can be added unless 'only' is used. The terms of a singular form can include plural forms unless referred to the contrary.

In construing an element, the element is construed as including an error range although there is no explicit description.

In describing a position relationship, for example, when a position relation between two parts is described such as 'on,' 'over,' 'under,' 'below,' 'next,' etc., one or more other parts can be disposed between the two parts unless 'just' or 'direct' is used.

In describing a temporal relationship, for example, when the temporal order is described as "after," "subsequent," "next," and "before," a case which is not continuous can be included, unless "just" or "direct" is used.

It will be understood that, although the terms "first," "second," etc. can be used herein to describe various elements, these elements should not be limited by these terms. These terms are only used to distinguish one element from another and may not define order or sequence. For example, a first element could be termed a second element, and, similarly, a second element could be termed a first element, without departing from the scope of the present disclosure.

In addition, terms such as "X-axis direction," "Y-axis direction" and "Z-axis direction" should not be construed by a geometric relation only of a mutual vertical relation and can have broader directionality within the range that elements of the present disclosure can act functionally.

The term "at least one" should be understood as including any and all combinations of one or more of the associated listed items. For example, the meaning of "at least one of a first item, a second item and a third item" denotes the combination of all items proposed from two or more of the first item, the second item and the third item as well as the first item, the second item or the third item.

Features of various embodiments of the present disclosure can be partially or overall coupled to or combined with each other and can be variously inter-operated with each other and driven technically as those skilled in the art can sufficiently understand. Further, all the components of each display apparatus and each optical member/device according to all embodiments of the present disclosure are operatively coupled and configured.

The embodiments of the present disclosure can be carried out independently from each other or can be carried out together in co-dependent relationship.

Hereinafter, the preferred embodiments of the present disclosure will be described in detail with reference to the accompanying drawings.

Figure 2:
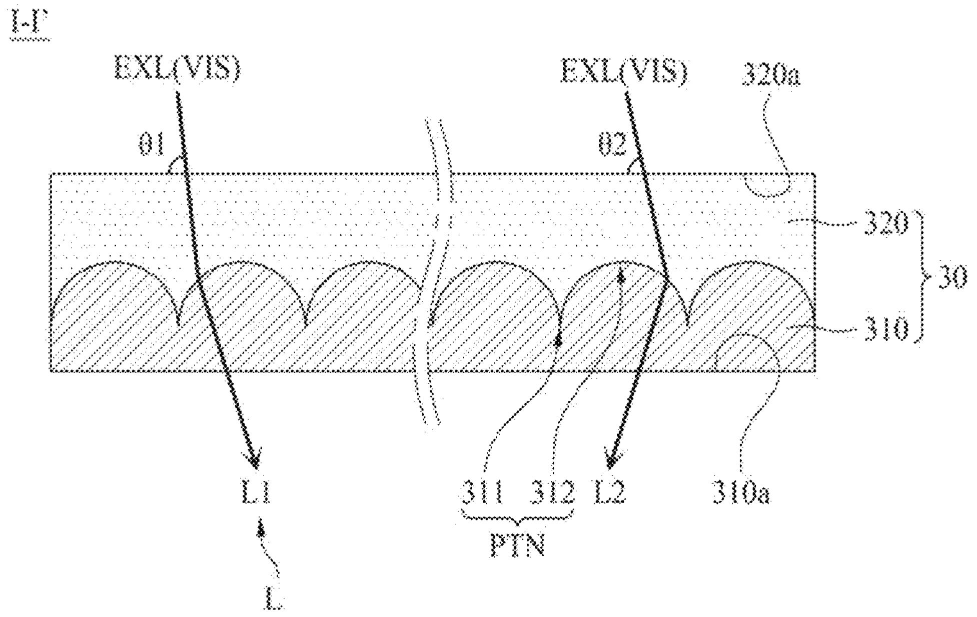
FIG. 2 is a schematic cross-sectional view illustrating an optical member and illustrating a light transmission of visible light in the optical member, along line I-I' shown in FIG. 1 according to one embodiment of the present disclosure.
Figure 3:
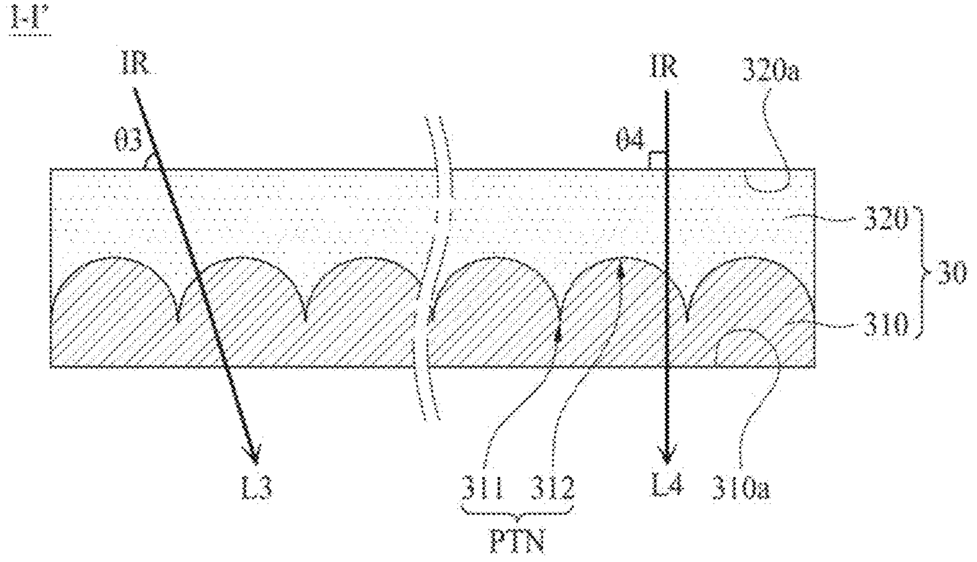
FIG. 3 is a schematic cross-sectional view illustrating an optical member and illustrating a light transmission of infrared light in the optical member, along line I-I' shown in FIG. 1 according to one embodiment of the present disclosure.
Figure 4:
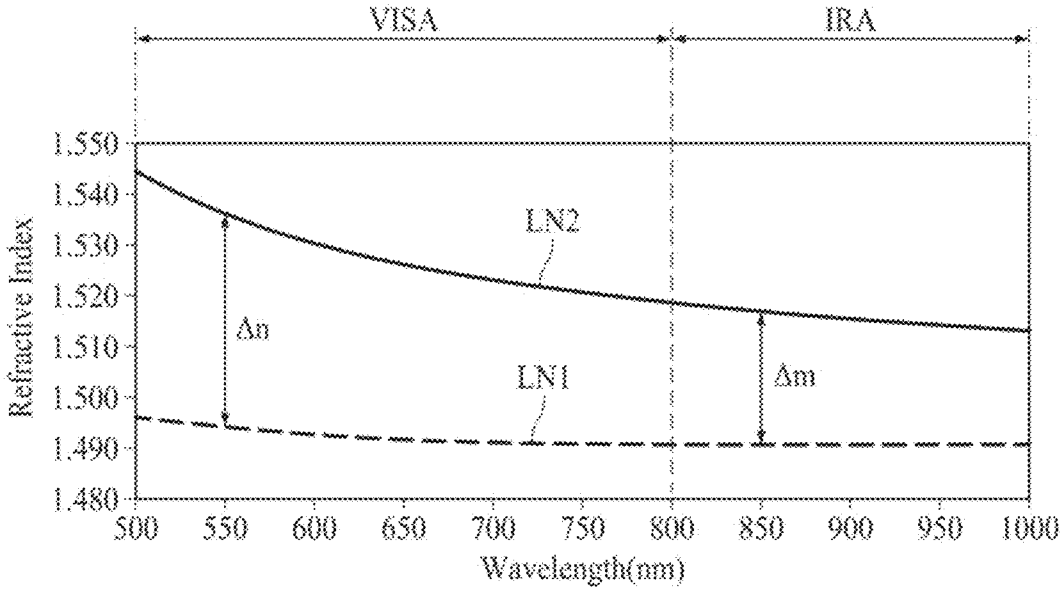
FIG. 4 is a graph illustrating an example of a refractive index based on wavelengths of a first layer and a second layer of an optical member according to one embodiment of the present disclosure.
Figure 5A:
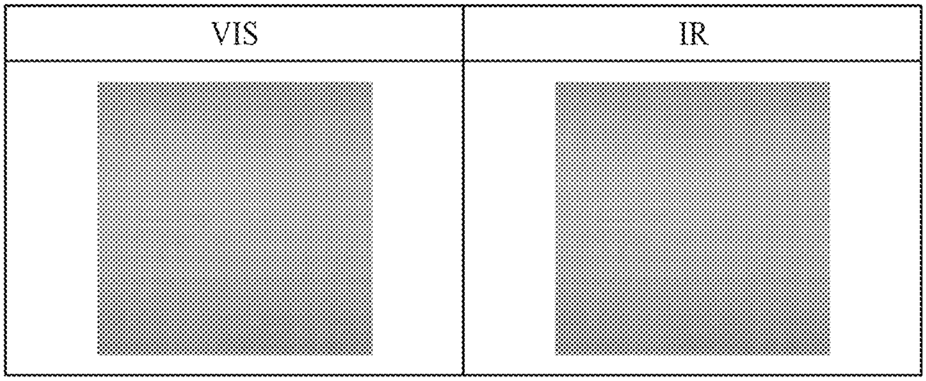
FIG. 5A illustrates an example of an image of a Comparative Example, which is obtained by photographing an alignment mark of a display apparatus in which a difference in a refractive index between a first layer and a second layer is not changed depending on wavelengths, through a visible light camera and an infrared camera.
Figure 5B:
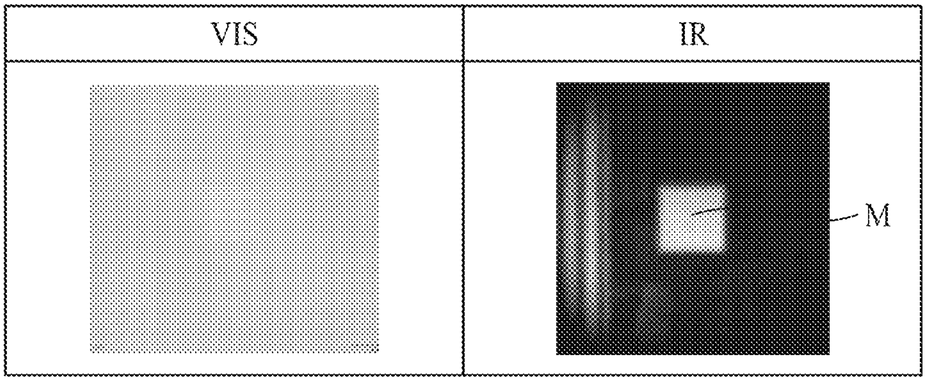
FIG. 5B illustrates an example of an image of a display apparatus according to one embodiment of the present disclosure, which is obtained by photographing an alignment mark through a visible light camera and an infrared camera.
Figure 6:
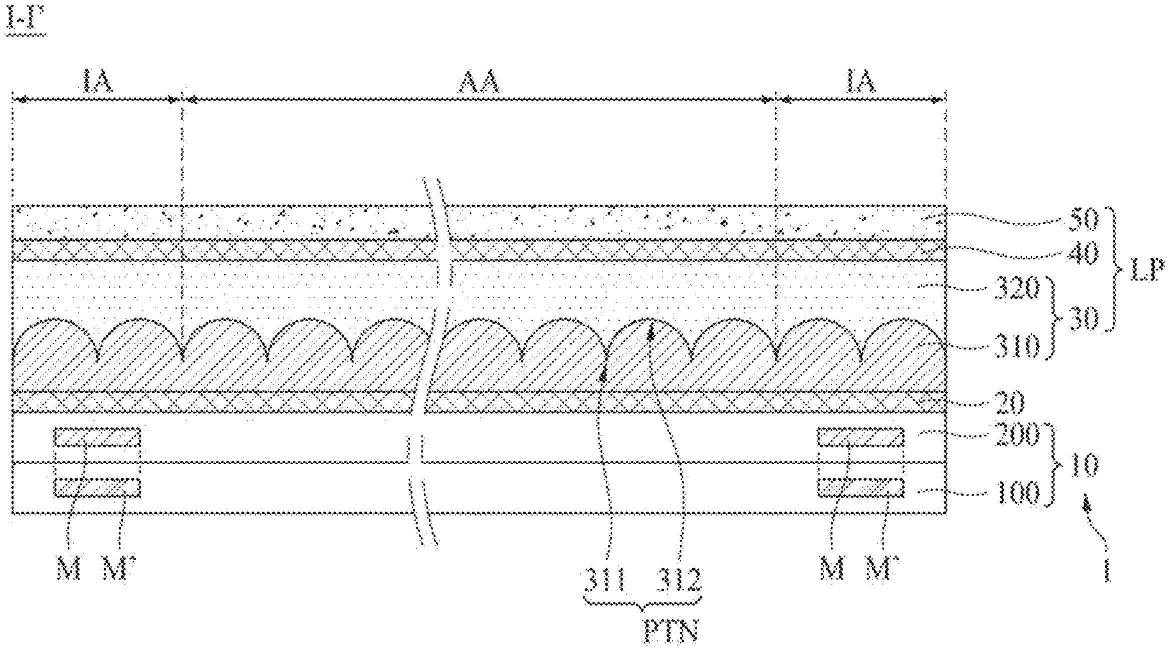
FIG. 6 is a schematic cross-sectional view of the display apparatus taken along line I-I' shown in FIG. 1 according to one embodiment of the present disclosure.

FIG. 1 is a schematic perspective view illustrating a display apparatus according to one embodiment of the present disclosure. FIG. 2 is a schematic cross-sectional view illustrating an optical member and illustrating a light transmission of visible light in the optical member, along line I-I' shown in FIG. 1 according to one embodiment of the present disclosure. FIG. 3 is a schematic cross-sectional view illustrating an optical member and illustrating a light transmission of infrared light in the optical member, along line I-I' shown in FIG. 1 according to one embodiment of the present disclosure. FIG. 4 is a graph illustrating an example of a refractive index based on wavelengths of a first layer and a second layer of an optical member according to one embodiment of the present disclosure. FIG. 5A illustrates an example of an image of a Comparative Example, which is obtained by photographing an alignment mark of a display apparatus in which a difference in a refractive index between a first layer and a second layer is not changed depending on wavelengths, through a visible light camera and an infrared camera. FIG. 5B illustrates an example of an image of a display apparatus according to one embodiment of the present disclosure, which is obtained by photographing an alignment mark through a visible light camera and an infrared camera. FIG. 6 is a schematic cross-sectional view of the display apparatus taken along line I-I' shown in FIG. 1 according to one embodiment of the present disclosure;

Referring to FIG. 1, a display apparatus 1 according to one embodiment of the present disclosure can include a display panel 10 configured to display images and an optical member 30 disposed on the display panel.

Referring to FIGS. 2 to 6, the optical member 30 according to one embodiment of the present disclosure can include a first layer 310 including a pattern portion PTN, and a second layer 320 covering the pattern portion PTN. At least one of the first layer 310 or the second layer 320 can have a refractive index varied depending on a wavelength area. For example, the first layer 310 and the second layer 320 are made of materials having different refractive indexes depending on wavelengths, so that the refractive indexes can be varied depending on the wavelengths. The fact that the refractive indexes are varied depending on the wavelengths can mean that the refractive index is changed to be small or large (or different from each other) depending on when the wavelength is increased or reduced. For example, it can mean that the refractive index of at least one of the first and second layers 310 and 320 when a visible ray (or visible light) passes such layer and the refractive index of at least one of the first and second layers 310 and 320 when an infrared ray (or infrared light) passes such layer are different from each other.

The wavelength area can include a visible ray area VISA (shown in FIG. 4) and an infrared area IRA having a wavelength longer than that of the visible ray area VISA. The first layer 310 according to one example can be changed so that its refractive index can be reduced from the visible ray area VISA toward the infrared area IRA. The second layer 320 according to one example can be changed so that its refractive index can be reduced from the visible ray area VISA toward the infrared area IRA. Since the first layer 310 and the second layer 320 are not made of the same material, changes in their refractive index can be different from each other.

The difference in the refractive index between the first layer 310 and the second layer 320 can be greater in the visible ray area VISA than in the infrared area IRA.

When the difference in the refractive index is great or large, the light incident on the optical member 30 can be more greatly or largely refracted by the Snell's law. Therefore, a background or an image positioned on an emission surface of the optical member 30 can be seen to be distorted in the visible ray area VISA having a large difference in the refractive index. The emission surface of the optical member 30 can be a surface opposite to an incident surface on which light is incident. Since the visible ray area VISA is an area that can be identified with the naked eye of a person, the distorted image can be identified by a vision camera or a general camera.

On the other hand, when the difference in the refractive index between the first layer 310 and the second layer 320 is small or when there is no difference in the refractive index, the light incident on the optical member 30 is not significantly refracted by the Snell's law, so that a light path can be formed in a straight line shape or a shape close to the straight line. Therefore, when the difference in the refractive index is small or when there is no difference in the refractive index, the background or the image positioned on the emission surface of the optical member 30 can be clearly seen without distortion in the infrared area IRA. Since the infrared area IRA is an area that cannot be identified with the naked eye, an image (or clear image) that is not distorted can be identified by the infrared camera.

As such, when the optical member 30 is coupled to the display panel, a vision recognition rate of the infrared camera with respect to an alignment mark, which is used for alignment such as bonding alignment and provided on the display panel, can be improved. The alignment mark according to one example can be formed on an opposing substrate 200 (shown in FIG. 6) that is opposite to a substrate 100 and included in the display apparatus 1 according to one embodiment of the present disclosure. In addition, a sub-alignment mark aligned with the alignment mark can be formed on the substrate 100 (shown in FIG. 6) included in the display apparatus 1 according to one embodiment of the present disclosure.

Meanwhile, when the difference in the refractive index between the first layer 310 and the second layer 320 is great or large, since the light incident on the optical member 30 is refracted more largely than the case that the difference in the refractive index between the first layer 310 and the second layer 320 is small, the intensity of light can be reduced through constructive interference and destructive interference. When the optical member 30 is coupled to the display panel, the intensity of external light incident on the display panel can be reduced, whereby reflectance of external light can be reduced.

Therefore, in the optical member 30 according to one embodiment of the present disclosure, when the visible ray such as external light passes, the refractive index can be changed so that the difference in the refractive index between the first layer 310 and the second layer 320 is increased, whereby the reflectance of external light with respect to the naked eye or the vision camera can be reduced by reducing the intensity of external light. When the infrared ray passes the optical member 30, the refractive index can be changed so that the difference in the refractive index between the first layer 310 and the second layer 320 is small or does not exist, whereby clarity of the background, the image, and a mark, which are positioned on the emission surface, can be improved to enhance the vision recognition rate of the infrared camera with respect to the background, the image and the mark.

Hereinafter, the optical member 30 according to one embodiment of the present disclosure will be described in more detail with reference to FIGS. 1 to 6.

Referring to FIGS. 2 and 3, incident light incident on one surface of the optical member 30 can be refracted or not refracted while passing through the optical member 30 and is emitted to the other surface of the optical member 30 in the form of emission light L. In this case, the incident light can be a visible ray (or visible light) or an infrared ray (or infrared light).

The first layer 310 of the optical member 30 according to one example can include the pattern portion PTN. The pattern portion PTN according to one example can include a plurality of concave portions 311 and a plurality of convex portions 312 between the plurality of concave portions 311.

The plurality of convex portions 312 according to one example can be formed in the same shape (or a regular shape) like a hemispherical shape (or a lens shape), but the present disclosure is not limited thereto. The plurality of convex portions 312 according to another example can be provided so that radiuses of the convex portions 312 adjacent to each other and/or the height from a lower surface 310*a* of the first layer 310 can be different from each other. For example, the pattern portion PTN, which includes the plurality of convex portions 312 and the plurality of concave portions 311 according to another example, can be formed in an atypical shape. In one instance, the shape of each concave portion can be the same or different or slightly different from each other.

The second layer 320 of the optical member 30 can be formed to cover the first layer 310 that includes the pattern portion PTN. The second layer 320 can be formed to cover the first layer 310, so that its upper surface 320*a* can be flat.

In detail, in the optical member 30 according to one embodiment of the present disclosure, the other surfaces except a boundary surface between the first layer 310 and the second layer 320 in the pattern portion PTN, for example, the incident surface (or the upper surface 320*a* of the second layer 320) on which light is incident, and the emission surface (or the lower surface 310*a* of the first layer 310) to which light is emitted can be provided to be flat. Therefore, since the optical member 30 according to one embodiment of the present disclosure can be easily coupled to the display panel 10 through an adhesive 20 (shown in FIG. 6) such as OCA (optically clear adhesive) and PSA (pressure sensitive adhesive), versatility can be improved.

The second layer 320 can be made of a material having a refractive index different from that of the first layer 310. For example, the second layer 320 can be made of a material different from that of the first layer 310, and thus can have a refractive index different from that of the first layer 310. In this case, the refractive index of the second layer 320 can be provided to be smaller than or greater than that of the first layer 310.

For example, the refractive index of the second layer 320 can be provided to be greater than that of the first layer 310. Therefore, as shown in FIG. 2, external light EXL (or visible ray VIS) can be refracted on the boundary surface between the first layer 310 and the second layer 320. For example, as shown in FIG. 2, the external light EXL (or visible ray VIS) incident on the upper surface 320*a* of the second layer 320 at a first angle θ1 can be refracted on the boundary surface between the first layer 310 and the second layer 320 and emitted as the first emission light L1. The external light EXL (or visible ray VIS) incident on a left side based on the center of the convex portion 312 most spaced apart from the lower surface 310*a* of the first layer 310 can be refracted toward a right side based on FIG. 2 and then emitted as the first emission light L1. As shown in FIG. 2, the external light EXL (or visible ray VIS) incident on the upper surface 320*a* of the second layer 320 at a second angle θ2 can be refracted on the boundary surface between the first layer 310 and the second layer 320 and emitted as the second emission light L2. The external light (or visible ray VIS) incident toward the right side based on the center of the convex portion 312 that is most spaced apart from the lower surface 310*a* of the first layer can be refracted toward the left side based on FIG. 2 and emitted as the second emission light L2.

Each of the first angle θ1 and the second angle θ2 can be an angle of 0° to 90° based on the upper surface 320*a* of the second layer 320. As shown in FIG. 2, since the difference in the refractive index between the first layer 310 and the second layer 320 is increased when the external light EXL (or visible ray VIS) passes, the external light EXL (or visible ray VIS) can be refracted on the boundary surface between the first layer 310 and the second layer 320.

Meanwhile, as shown in FIG. 3, even though the refractive index of the second layer 320 is greater than that of the first layer 310, the infrared ray IR (or infrared light IR) may not be refracted on the boundary surface between the first layer 310 and the second layer 320. For example, as shown in FIG. 3, the infrared ray IR (or infrared light IR) incident on the upper surface 320*a* of the second layer 320 at a third angle θ3 can be emitted as the third emission light L3 without being refracted on the boundary surface between the first layer 310 and the second layer 320. In addition, the external light EXL (or visible ray VIS) incident on the upper surface 320*a* of the second layer 320 at a fourth angle θ4 can be emitted as the fourth emission light L4 without being refracted on the boundary surface between the first layer 310 and the second layer 320. Each of the third angle θ3 and the fourth angle θ4 can be an angle of 0° to 90° based on the upper surface 320*a* of the second layer 320.

Since the infrared ray IR (or infrared light IR) is not refracted on the boundary surface between the first layer 310 and the second layer 320, even though the infrared light is incident on the left side or the right side based on the center of the convex portion 312, the infrared light can be emitted to a straight light path without being refracted. The reason why the infrared ray IR (or infrared light IR) is not refracted on the boundary surface between the first layer 310 and the second layer 320 is that the difference in the refractive index between the first layer 310 and the second layer 320 is reduced for the infrared ray IR, but the present disclosure is not limited thereto. The infrared ray IR (or infrared light IR) can be refracted on the boundary surface between the first layer 310 and the second layer 320 at a predetermined angle. However, even in this case, the infrared ray IR (or infrared light IR) can have a smaller refractive angle on the boundary surface between the first layer 310 and the second layer 320 than the external light EXL (or the visible ray VIS).

Therefore, in the optical member 30 according to one embodiment of the present disclosure, when the visible ray such as external light passes, since the difference in the refractive index between the first layer 310 and the second layer 320 is great or large, reflectance of external light with respect to the naked eye or the vision camera can be reduced. When infrared ray passes, since the difference in the refractive index between the first layer 310 and the second layer 320 is small or does not exist, clarity of the background, the image and the mark, which are positioned on the emission surface, can be improved to improve the vision recognition rate of the infrared camera with respect to at least one of the background, the image or the mark.

In FIG. 2, refractive characteristics of light due to the difference in the refractive index between the first layer 310 and the second layer 320 has been described as an example, but the optical member 30 according to one embodiment of the present disclosure is provided to include the plurality of concave portions 311 and the plurality of convex portions 312, thereby refracting external light passing through each of the plurality of concave portions 311 and the plurality of convex portions 312 and simultaneously diffracting and/or scattering the external light so as to maximize decrease in light intensity. Therefore, the optical member 30 according to one embodiment of the present disclosure can maximize a decrease in reflectance with respect to the external light EXL (or visible ray VIS).

The display apparatus 1 according to one embodiment of the present disclosure can include the display panel 10 having a light extraction portion 140 (shown in FIG. 10) for improving light extraction efficiency, and the optical member 30 coupled onto the display panel 10. In this case, since the intensity of the external light incident on the light extraction portion can be reduced by the optical member, a diffraction pattern of reflective light generated in the light extraction portion can be suppressed or minimized, or occurrence of a radial rainbow pattern and a radial circular ring pattern of the reflective light due to non-regularity or randomness of the diffraction pattern of the reflective light can be suppressed or minimized.

Further, in the display apparatus 1 according to one embodiment of the present disclosure, since the external light can be subdivided by diffraction and/or scattering by the optical member 30, occurrence of the radial rainbow pattern and the radial circular ring pattern due to the external light can be suppressed or minimized, whereby real black visibility in a non-driving or off state can be implemented.

In the optical member 30 according to one embodiment of the present disclosure, the refractive index of the second layer 320 can be greater than that of the first layer 310. In this case, the change in the refractive index of the second layer 320 can be greater than the change in the refractive index of the first layer 310 from a visible ray area VISA toward an infrared area IRA.

Referring to FIG. 4, a horizontal axis represents a wavelength, and a vertical axis represents a refractive index. LN1 represents the refractive index of the first layer 310, and LN2 represents the refractive index of the second layer 320, which is greater than that of the first layer 310. The visible ray area VISA can be an area of 500 nm to 800 nm, and the infrared area IRA can be 800 nm or more. As shown in FIG. 4, it can be seen that the first layer 310 and the second layer 320 have refractive indexes that are lowered from the visible ray area VISA toward the infrared area IRA. In this case, it can be seen that the refractive index of LN2 is reduced to be greater than that of LN1. For example, the change in the refractive index of the second layer 320 can be greater than the change in the refractive index of the first layer 310 from the visible ray area VISA toward the infrared area IRA. For instance, the slope of the line LN2 extending across the visible ray area VISA and the infrared area IRA is steeper (greater change) than the slope of the line LN1.

For example, the refractive index of the second layer 320 is reduced from about 1.537 to about 1.519 as much as about 0.018 between the wavelength of 550 nm and 850 nm, whereas the refractive index of the first layer 310 is reduced from about 1.493 to about 1.49 as much as about 0.003 for the same same wavelengths. Therefore, it can be seen that the change in the refractive index of the second layer 320 according to the wavelength is greater than that of the first layer 310. This is because that a material of the second layer 320 and a material of the first layer 310 are different from each other.

For instance, according to the present disclosure, the refractive index of the second layer 320 is set higher than that of the first layer 310 and the difference in such refractive indices in the visible ray area VISA is set to exceed 0.03 but to be less than or equal to 0.4. The refractive indices can be controlled, e.g., by using a type of material used in the first and second layers 310 and 320.

The second layer 320 according to one example can include or be composed of: an acrylate-based compound containing at least one of epoxy acrylate or fluorine epoxy acrylate, or a compound containing silicon (Si), titanium (Ti), sulfur (S), aluminum (Al), zinc (Zn), tantalum (Ta), magnesium (Mg), yttrium (Y), and/or hafnium (Hf). That is, the material of the second layer 320 can be a material (or resin) having a large change in the refractive index in accordance with the wavelength. In this case, the first layer 310 can include or be composed of: an acrylate-based compound containing at least one of silicon modified acrylate or urethane acrylate, or a compound containing zirconium (Zr), fluorine (F) and sodium (Na). That is, the material of the first layer 310 can be a material (or resin) having a small change in the refractive index in accordance with the wavelength.

Accordingly, the optical member 30 according to one embodiment of the present disclosure can be provided so that the difference in the refractive index between the first layer 310 and the second layer 320 in the visible ray area VISA exceeds 0.03 but is less than or equal to 0.4. For example, as shown in FIG. 4, a difference Δn in the refractive index between the second layer 320 and the first layer 310 in the visible ray area VISA of wavelength 550 nm can be about 0.044. If the difference in the refractive index between the first layer 310 and the second layer 320 exceeds 0.4, material reliability of the first layer 310 and/or the second layer 320 can be deteriorated. In addition, if the difference in the refractive index between the first layer 310 and the second layer 320 is 0.03 or less, since a decrease in the intensity of the external light (or visible ray) is small, a radial rainbow pattern and a radial circular ring pattern of the reflective light can be generated.

Therefore, in the optical member 30 according to one embodiment of the present disclosure, the difference in the refractive index between the first layer 310 and the second layer 320 in the visible ray area VISA exceeds 0.03 and is less than or equal to 0.4, whereby material reliability can be improved, and occurrence of the radial rainbow pattern and the radial circular ring pattern of the reflective light can be suppressed or minimized.

On the other hand, regarding the infrared area IRA, the optical member 30 according to one embodiment of the present disclosure can be provided so that the difference in the refractive index between the first layer 310 and the second layer 320 in the infrared area IRA is 0.03 or less. For example, as shown in FIG. 4, in the infrared area IRA with the wavelength of 850 nm, the difference Δm in the refractive index between the second layer 320 and the first layer 310 can be about 0.027. If the difference in the refractive index between the first layer 310 and the second layer 320 is more than 0.03, the infrared ray is greatly refracted on the boundary surface between the first layer 310 and the second layer 320, whereby the vision recognition rate can be reduced.

Therefore, by providing the optical member 30 according to one embodiment of the present disclosure that has the difference in the refractive index between the first layer 310 and the second layer 320 in the infrared area IRA which is 0.03 or less, clarity of each of the background, the image and the mark can be improved, whereby a recognition rate of the infrared camera with respect to at least one of the background, the image or the mark can be improved.

Consequently, in the optical member 30 according to one embodiment of the present disclosure, as the first layer 310 and the second layer 320 having different changes in the refractive index depending on wavelengths are provided to be stacked with each other, the difference in the refractive index between the first layer 310 and the second layer 320 is large when the visible ray such as external light passes, whereby the reflectance of the external light with respect to the naked eye or the vision camera can be reduced. Further, in the optical member 30 according to one embodiment of the present disclosure, the first layer 310 and the second layer 320 having different changes in the refractive index depending on wavelengths can be provided to be stacked with each other, so that the difference in the refractive index between the first layer 310 and the second layer 320 is small or does not exist when the infrared ray passes, whereby the vision recognition rate of the infrared camera with respect to the background, the image and the mark can be improved. As described above, the difference in the refractive index between the first layer 310 and the second layer 320 depending on wavelengths can be implemented by the difference in the materials respectively constituting the first layer 310 and the second layer 320.

Referring to FIGS. 5A and 5B, FIG. 5A illustrates an image of a Comparative Example, which is obtained by photographing an alignment mark of a display apparatus in which the difference in the refractive index between the first layer 310 and the second layer 320 is not changed depending on the wavelengths, by a visible light camera and an infrared camera, whereas FIG. 5B illustrates an image photographed by the visible light camera and the infrared camera of the alignment mark M of the display apparatus according to one embodiment of the present disclosure.

For example, a display apparatus of a Comparative Example is the case that the second layer 320 having a refractive index greater than that of the first layer 310 is provided on the first layer 310, but the difference in the refractive index between the first layer 310 and the second layer 320 is not changed depending on the wavelength. Therefore, as in the left image of FIG. 5A, in the display apparatus of the Comparative Example, the difference in the refractive index between the first layer 310 and the second layer 320 is large even though the alignment mark is photographed by the visible light camera (or the vision camera), and thus the visible ray VIS can be refracted on the boundary surface between the first layer 310 and the second layer 320. As such, as shown in the left image of FIG. 5A, the alignment mark of the display apparatus of the Comparative Example is not identified by the visible light camera (or vision camera) (e.g., alignment mark is not shown). In addition, as shown in the right image of FIG. 5A, since the difference in the refractive index between the first layer 310 and the second layer 320 is large, when the alignment mark is photographed by the infrared camera, the infrared ray IR can be refracted on the boundary surface between the first layer 310 and the second layer 320. As such, as shown in the right image of FIG. 5A, the alignment mark of the display apparatus of the Comparative Example may not be identified by the infrared camera (e.g., alignment mark is also not shown). Such can be a limitation.

On the contrary, in case of the display apparatus 1 according to one embodiment of the present disclosure, the second layer 320 having a refractive index greater than that of the first layer 310 is provided on the first layer 310 that includes the pattern portion PTN, and the refractive indexes of the first layer 310 and the second layer 320 are set and different depending on the wavelengths as described above. In that case, as shown in the right image of FIG. 5B, in the display apparatus 1 according to one embodiment of the present disclosure, since the difference in the refractive index between the first layer 310 and the second layer 320 is small or does not exist when the alignment mark is photographed by the infrared camera, the infrared ray IR may not be refracted on the boundary surface between the first layer 310 and the second layer 320. Therefore, in the display apparatus 1 according to one embodiment of the present disclosure, the alignment mark M can be clearly identified by the infrared camera as shown in FIG. 5B, which is advantageous.

Therefore, as shown in FIG. 6, in the display apparatus 1 according to one embodiment of the present disclosure, since the alignment mark M formed on the opposing substrate 200 and a sub-alignment mark M' formed on the substrate 100 can be clearly recognized by the infrared camera, alignment accuracy of the opposing substrate 200 and the substrate 100 can be greatly improved.

The alignment mark M and the sub-alignment mark M' according to one embodiment can be disposed in the non-display area IA of the display apparatus 1 according to one embodiment of the present disclosure. As shown in FIG. 6, the non-display area IA according to one embodiment can be disposed along an edge of the display area AA. The display area (or active area) AA is an area from which an image is output, and can include a plurality of pixels P (e.g., shown in FIG. 7) having a plurality of subpixels SP (shown in FIG. 7). The non-display area IA can be expressed as being disposed to surround (completely or partially) the display area AA. The non-display area IA can include a peripheral circuit portion 120 (shown in FIG. 7) connected to the plurality of subpixels SP.

Although the alignment mark M of the display apparatus 1 has been described as an example, a tap bonding mark for bonding the printed circuit board PCB for driving the plurality of subpixels SP to a tab provided on the substrate 100 can be applied. Therefore, in the display apparatus 1 according to one embodiment of the present disclosure, even though the optical member 30 is provided on the display panel 10, the tab bonding mark for bonding the printed circuit board PCB to the tab of the substrate 100 can be clearly recognized, whereby assembly can be improved to reduce a pixel driving defect.

Meanwhile, as shown in the left image of FIG. 5B, since the display apparatus 1 according to one embodiment of the present disclosure has a large difference in the refractive index between the first layer 310 and the second layer 320 when the alignment mark is photographed by the visible light camera (or the vision camera), the visible ray VIS can be refracted on the boundary surface between the first layer 310 and the second layer 320. As such, in the display apparatus 1 according to one embodiment of the present disclosure, the alignment mark can be hardly identified by the visible light camera (or the vision camera). Therefore, in the display apparatus 1 according to one embodiment of the present disclosure, since the intensity of the external light incident on the light extraction portion (e.g., 140 shown in FIGS. 10 and 11) can be reduced by the optical member 30, the diffraction pattern of the reflective light generated in the light extraction portion can be suppressed or minimized, or occurrence of the radial rainbow pattern and the radial circular ring pattern of the reflective light due to non-regularity or randomness of the diffraction pattern of the reflective light can be suppressed or minimized.

Figure 7:
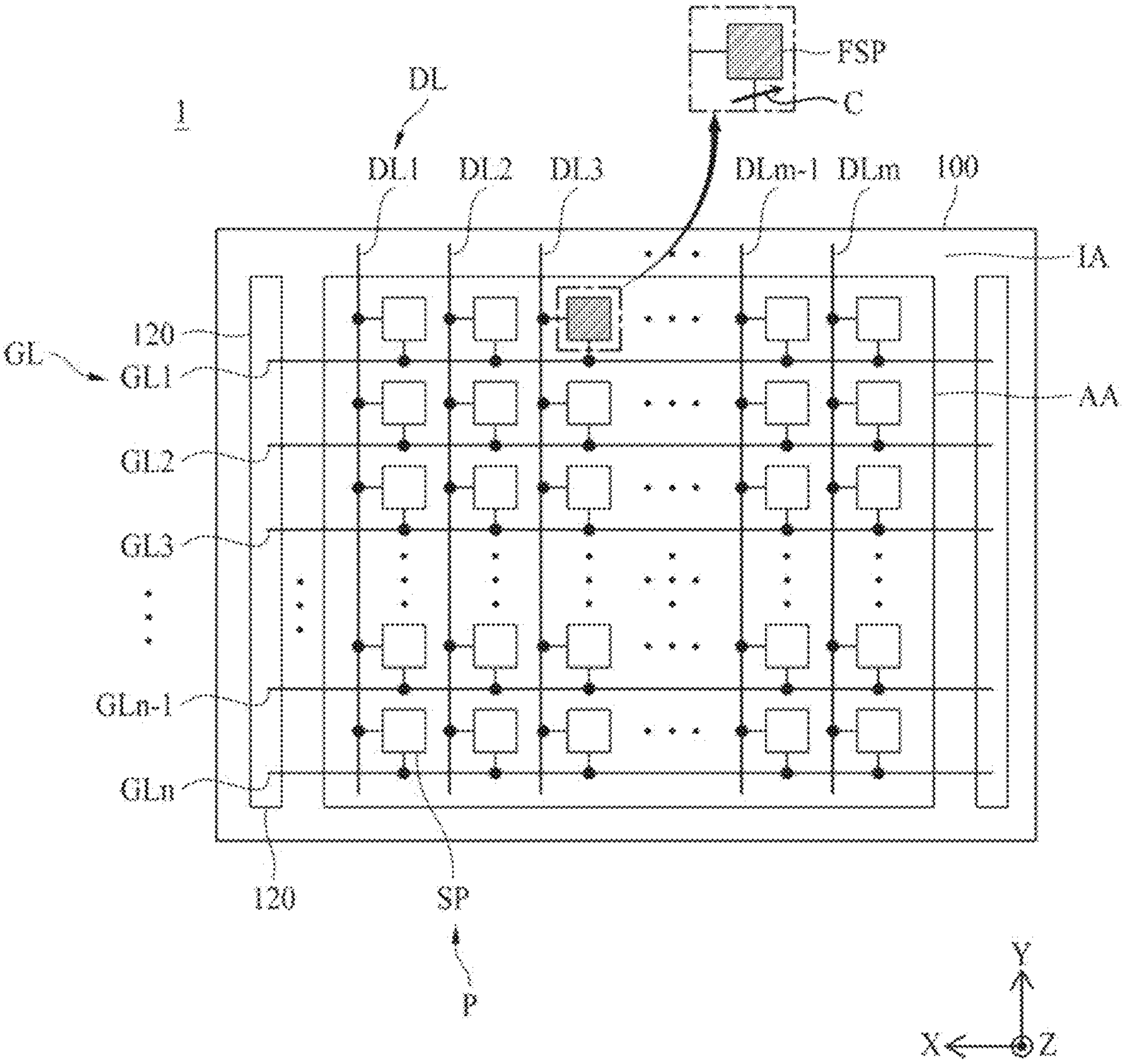
FIG. 7 is a schematic circuit view illustrating a display apparatus according to one embodiment of the present disclosure.

FIG. 7 is a schematic circuit view illustrating a display apparatus according to one embodiment of the present disclosure. The display apparatus 1 of the present disclosure can have the configuration of FIG. 7 or other suitable configuration.

Referring to FIG. 7, in the display apparatus 1 according to one embodiment of the present disclosure, a plurality of gate lines GL connected to the peripheral circuit portion 120 can be connected to the plurality of subpixels SP to apply a gate signal for driving each of the plurality of subpixels SP. In addition, the plurality of data lines DL crossing the plurality of gate lines GL can be respectively connected to the plurality of subpixels SP to apply a data signal for driving each of the plurality of subpixels SP.

The plurality of gate lines GL can be disposed in a second direction (Y-axis direction) as 'n' number of gate lines GL where 'n' can be a positive number or integer. For example, an end of each of the first gate line GL1 to the (n)th gate line GLn can be disposed in the peripheral circuit portion 120. The plurality of data lines DL can be disposed in a first direction (X-axis direction) as 'm' number of data lines DL where 'm' can be a positive number or integer. For example, an end of each of the first data line DLI to the (m)th data lines DLm can be disposed in the non-display area IA positioned above the display area AA. The first direction (Approved, thanks.-axis direction) can be a horizontal direction (or long side direction) of the display apparatus 1 based on FIG. 1. The second direction (Y-axis direction) is a direction perpendicular to the first direction (X-axis direction), and can be a vertical direction (or short side direction) of the display apparatus 1 based on FIG. 1. A third direction (Z-axis direction) is a direction perpendicular to each of the first direction (X-axis direction) and the second direction (Y-axis direction), and can be a thickness direction of the display apparatus 1.

In the display apparatus 1 according to one embodiment of the present disclosure, the second layer 320 having a refractive index greater than that of the first layer 310 is provided on the first layer 310 that includes the pattern portion PTN, and the refractive indexes of the first layer 310 and the second layer 320 can be provided differently depending on the wavelengths. The change in the refractive index of the second layer 320 depending on the wavelength can be greater than the change in the refractive index of the first layer 310 depending on the wavelength, e.g., as shown in FIG. 4. Therefore, in the display apparatus 1 according to one embodiment of the present disclosure, since the difference in the refractive index between the first layer 310 and the second layer 320 is small or does not exist when the infrared ray passes, the circuit portion connected to the subpixel SP provided in the display panel 10, for example, the gate line GL of the circuit portion can be visible (or identified) by the infrared camera.

Therefore, the display apparatus 1 according to another embodiment of the present disclosure can identify and specify a gate line connected to a defective subpixel FSP in which a defect has occurred during an inspection process of the display panel 10. In that case, a laser repair process for cutting (C) only a gate line connected to the defective subpixel FSP by using laser can be easily performed to address the issue effectively.

As a result, the display apparatus 1 according to another embodiment of the present disclosure can reduce a laser repair process time through the infrared camera, and can improve battery service life by preventing a power source or power from being unnecessarily supplied to the defective subpixel FSP, once the defective subpixel FSP is addressed through the laser repair process.

Figure 8:
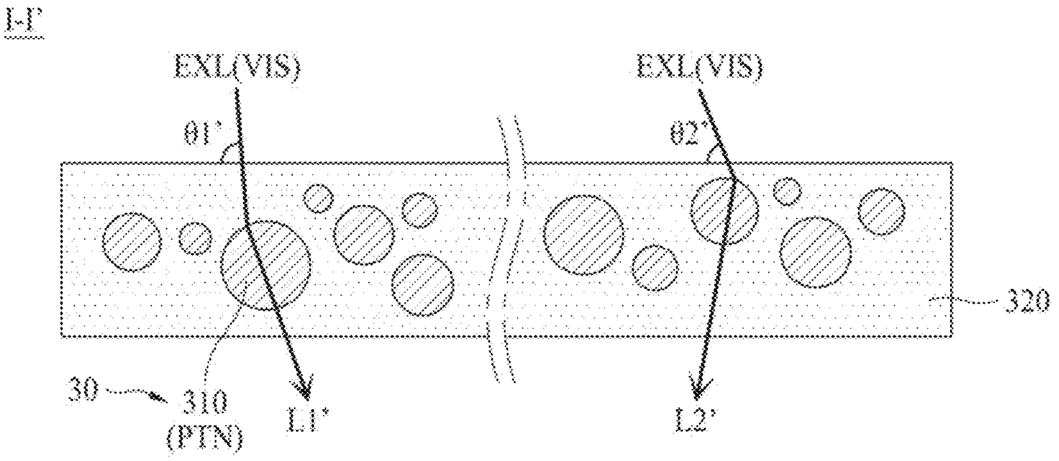
FIG. 8 is a schematic cross-sectional view illustrating an optical member and illustrating a light transmission of visible light in the optical member, along line I-I' shown in FIG. 1 according to another embodiment of the present disclosure.
Figure 9:
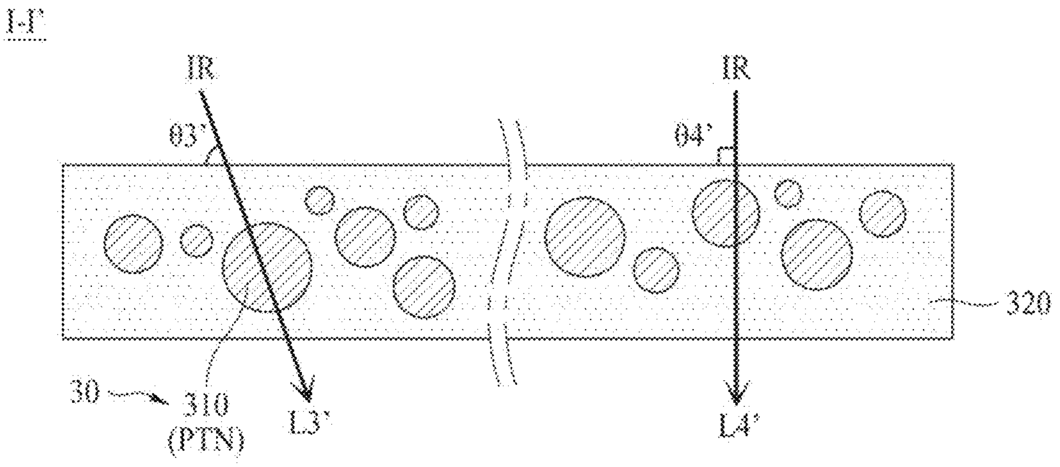
FIG. 9 is a schematic cross-sectional view illustrating an optical member and illustrating a light transmission of infrared light in the optical member, along line I-I' shown in FIG. 1 according to the another embodiment of the present disclosure.

FIG. 8 is a schematic cross-sectional view illustrating an optical member and illustrating a light transmission of visible light in the optical member along line I-I' shown in FIG. 1 according to another embodiment of the present disclosure, and FIG. 9 is a schematic cross-sectional view illustrating the optical member of FIG. 8 and illustrating a light transmission of infrared light according to the same embodiment of the present disclosure.

Referring to FIG. 8, the optical member 30 according to this embodiment of the present disclosure is the same as the optical member of FIG. 2 except that the pattern portion PTN is changed. Therefore, the same reference numerals will be given to the same elements as those of FIG. 2, and the following description will be based on differences from FIG. 2.

In case of the optical member according to FIG. 2 described above, the first layer 310 can include the pattern portion PTN, and the pattern portion PTN can include the plurality of concave portions 311 and the plurality of convex portions 312 between the plurality of concave portions 311. Therefore, the optical member 30 according to the previous embodiment of the present disclosure can be provided in a lens shape or a wave shape in a direction in which the boundary surface between the first layer 310 and the second layer 320 crosses the entire optical member 30, for example, in the first direction (X-axis direction, shown in FIG. 1) or in the second direction (Y-axis direction, shown in FIG. 1). Therefore, since that optical member 30 has a large difference in the refractive index between the first layer 310 and the second layer 320 when the visible ray passes, reflectance of the external light with respect to the naked eye or the vision camera can be reduced, whereby occurrence of a rainbow pattern and a radial circular ring pattern can be suppressed or minimized. Further, in the optical member 30 according to the previous embodiment of the present disclosure, since the difference in the refractive index between the first layer 310 and the second layer 320 is small or does not exist when the infrared ray passes, the recognition rate of the infrared camera with respect to the alignment mark can be improved, whereby an alignment defect of the substrate 100 (or the lower substrate) and the opposing substrate 200 (or the upper substrate) of the display panel 10 can be reduced.

On the contrary, in case of the optical member according to the embodiment of FIG. 8, the pattern portion PTN can include a plurality of scattering portions. Each scattering portion according to one example can be a bead. Since the pattern portion PTN is included in the first layer, the plurality of scattering portions can be denoted by a reference numeral of 310 and designated as the first layer in FIG. 8.

As shown in the embodiment of FIG. 8, the plurality of beads (scattering portions) can be formed in various sizes. Although a circular bead is shown in FIG. 8, the present disclosure is not limited thereto, and each of the plurality of beads can be formed in various shapes such as diamond and trapezoid. The second layer 320 can be provided to surround the plurality of scattering portions 310 (first layer). In the optical member 30 according to FIG. 8, the refractive index of the plurality of scattering portions 310 (first layer) can be greater than that of the second layer 320. In addition, the change in the refractive index of the plurality of scattering portions 310 can be greater than the change in the refractive index of the second layer 320 from the visible ray area toward the infrared area. Therefore, in case of the optical member 30 according to one embodiment of FIG. 8, refractive scattering can occur due to a large difference in the refractive index between the plurality of scattering portions 310 and the second layer 320 surrounding the scattering portions 310 in the visible ray area in which the external light EXL (or the visible ray VIS) is distributed. Therefore, in the optical member 30 according to FIG. 8, the external light EXL (or the visible ray VIS) can be refracted on the boundary surface between the first layer 310 and the second layer 320.

For example, the external light EXL (or the visible ray VIS) incident on one surface of the optical member 30 can be refracted on the boundary surface between the first layer 310 and the second layer 320 and emitted as the first emission light L1' and the second emission light L2'. In addition, as shown in FIG. 9, the infrared ray IR (or infrared light IR) incident on one surface of the optical member 30 can be emitted as the third emission light L3' and the fourth emission light L4' without being refracted on the boundary surface between the first layer 310 and the second layer 320. The first emission light L1', the second emission light L2', the third emission light L3' and the fourth emission light L4' are the same as (or similar to) the first emission light L1, the second emission light L2, the third emission light L3 and the fourth emission light L4, which are described above, except that they pass through the plurality of scattering portions 310, and thus their description will be omitted or may be provided briefly.

Consequently, since the optical member 30 according to the embodiment of FIG. 8 has a large difference in the refractive index between the first layer 310 and the second layer 320 when the visible ray such as external light passes, reflectance of the external light can be reduced, whereby occurrence of a rainbow pattern and a radial circular ring pattern can be suppressed or minimized. In addition, the optical member 30 according to the embodiment of FIG. 8 can suppress or minimize occurrence of a radial rainbow pattern and a radial circular ring pattern due to the external light can be suppressed or minimized, whereby real black visibility in a non-driving or off state can be implemented.

Meanwhile, in case of the optical member 30 according to the embodiment of FIG. 8, the difference in the refractive index between the plurality of scattering portions 310 (first layer) and the second layer 320 surrounding the plurality of scattering portions 310 in the infrared area is small or does not exist (or the refractive indexes of the first layer 310 and the second layer 320 become similar to each other), so that a refractive scattering effect can be weakened. Therefore, since the difference in the refractive index between the first layer 310 and the second layer 320 is small or does not exist when the infrared ray passes, the infrared ray may not be refracted on the boundary surface between the first layer 310 and the second layer 320 as shown in FIG. 9. Therefore, the optical member 30 according to FIG. 8 can improve the vision recognition rate of the infrared camera with respect to the alignment mark M, thereby reducing the alignment defect of the substrate 100 (or the lower substrate) and the opposing substrate 200 (or the upper substrate) of the display panel 10.

As described above, in the optical member 30 according to the embodiment of FIG. 8, the change in the refractive index of the plurality of scattering portions 310 (first layer) can be greater than the change in the refractive index of the second layer 320 from the visible ray area toward the infrared area. This is because that the material of the scattering portion 310 and the material of the second layer 320 are different from each other.

According to one embodiment of the present disclosure, the plurality of scattering portions 310 can include or be composed of a first material that includes at least one of silicon oxide ($SiO_2$), titanium oxide ($TiO_2$), silicon nitride (SixNy), silicon oxide nitride (SiON), aluminum oxide (AlOx), aluminum nitride (AlON), zinc oxide (ZnO), tantalum pentoxide ($Ta_2O_5$), magnesium fluoride ($MgF_2$), yttrium oxide ($Y_2O_3$) or hafnium oxide ($HfO_2$), and/or a polymethyl methacrylate (PMMA), polycarbonate (PC), polyethylene terephthalate (PET), polyurethane (PU), polystyrene (PS) and nylon-based material to which the first material is added. For example, the plurality of scattering portions 310 can be beads having a large change in the refractive index depending on the wavelengths.

In this case, the second layer 320 can include or be composed of an acrylate-based compound that includes at least one of silicone-modified acrylate or urethane acrylate, or a compound containing zirconium (Zr), fluorine (F) and sodium (Na). For example, the second layer 320 described above can be a resin having a small change in the refractive index depending on the wavelengths.

In the optical member 30 according to this embodiment of the present disclosure, each of the plurality of scattering portions 310 and the second layer 320 are provided with their respective materials different from each other as described above, so that the difference in the refractive index between the plurality of scattering portions 310 and the second layer 320 can be reduced from the visible ray area toward the infrared area. Therefore, the optical member 30 according to this embodiment of the present disclosure can reduce reflectance of the external light when the visible ray passes, thereby suppressing or minimizing occurrence of the rainbow pattern and the radial circular ring pattern and implementing real black visibility in a non-driving or off state.

Further, since the optical member 30 according to this embodiment of the present disclosure can improve the vision recognition rate of the infrared camera with respect to the alignment mark M, the alignment defect of the substrate 100 (or the lower substrate) and the opposing substrate 200 (or the upper substrate) of the display panel 10 can be reduced, and the vision recognition rate of the infrared camera with respect to the tab bonding mark can be improved, whereby an adhesion defect of the printed circuit board PCB and the tab can be reduced.

Meanwhile, the optical member 30 of another modified embodiment of FIG. 8 can be provided so that the refractive index of the second layer 320 is greater than that of the plurality of scattering portions 310. In addition, the change in the refractive index of the second layer 320 can be greater than the change in the refractive index of the plurality of scattering portions 310 from the visible ray area to the infrared area.

Therefore, in case of the optical member 30 according to this another modified embodiment of FIG. 8, the difference in the refractive index between the plurality of scattering portions 310 and the second layer 320 in the visible ray area can be large so as to generate refractive scattering. Therefore, in the optical member 30 according to this another modified embodiment of FIG. 8, since the difference in the refractive index between the first layer 310 and the second layer 320 is large when the visible ray passes, reflectance of the external light can be reduced, whereby occurrence of a rainbow pattern and a radial circular ring pattern can be suppressed or minimized. In addition, the optical member 30 according to this another modified embodiment of FIG. 8 can suppress or minimize occurrence of a radial rainbow pattern and a radial circular ring pattern due to the external light, thereby implementing real black visibility in a non-driving or off state.

Meanwhile, in case of the optical member 30 according to this another modified embodiment of FIG. 8, the difference in the refractive index between the plurality of scattering portions 310 (first layer) and the second layer 320 is small or does not exist (or the refractive indexes of the first layer 310 and the second layer 320 are similar to each other) in the infrared area, so that a refractive scattering effect can be weakened. Therefore, since the difference in the refractive index between the first layer 310 and the second layer 320 is small or does not exist when the infrared ray passes, the infrared ray may not be refracted on the boundary surface between the first layer 310 and the second layer 320. Therefore, the optical member 30 according to this another modified embodiment of FIG. 8 can improve the vision recognition rate of the infrared camera with respect to the alignment mark M, thereby reducing the alignment defect of the substrate 100 (or the lower substrate) and the opposing substrate 200 (or the upper substrate) of the display panel 10.

As described above, in the optical member 30 according to this another modified embodiment of FIG. 8, the change in the refractive index of the second layer 320 can be greater than the change in the refractive index of the plurality of scattering portions 310 from the visible ray area toward the infrared area. This is because that the material of the second layer 320 and the material of the scattering portion 310 are different from each other.

In the optical member 30 according to this another modified embodiment of FIG. 8, the second layer 320 having a large change in the refractive index depending on the wavelengths can include an acrylate-based compound containing at least one of epoxy acrylate, fluorine epoxy acrylate, silicon modified acrylate or urethane acrylate, or a compound containing silicon (Si), titanium (Ti), sulfur (S), aluminum (Al), zinc (Zn), tantalum (Ta), magnesium (Mg), yttrium (Y) or hafnium (Hf).

In this case, the scattering portion 310 (or bead) having a small change in the refractive index depending on the wavelengths can include or be composed of a second material that includes at least one of polymethyl methacrylate (PMMA), polycarbonate (PC), polyethylene terephthalate (PET), or sodium hexafluoroaluminate ($Na_3AlF_6$), and/or a polyurethane (PU), polystyrene (PS) and nylon-based material to which the second material is added In the optical member 30 according to this another modified embodiment of FIG. 8, each of the plurality of scattering portions 310 and the second layer 320 are provided with their respective materials different from each other as described above, so that the difference in the refractive index between the plurality of scattering portions 310 and the second layer 320 can be reduced from the visible ray area toward the infrared area. Therefore, the optical member 30 according to this another modified embodiment of the present disclosure can reduce reflectance of the external light when the visible ray passes, thereby suppressing or minimizing occurrence of the rainbow pattern and the radial circular ring pattern and implementing real black visibility in a non-driving or off state.

Further, since the optical member 30 according to this another modified embodiment of the present disclosure can improve the vision recognition rate of the infrared camera with respect to the alignment mark M, the alignment defect of the substrate 100 (or the lower substrate) and the opposing substrate 200 (or the upper substrate) of the display panel 10 can be reduced, and the vision recognition rate of the infrared camera with respect to the tab bonding mark can be improved, whereby an adhesion defect of the printed circuit board PCB and the tab can be reduced.

Meanwhile, the optical member 30 according to one embodiment of the present disclosure can be provided so that the plurality of scattering portions 310 can have a haze (e.g., obscurity or cloudiness) of 0% or more and 90% or less. When the haze of the plurality of scattering portions 310 is 0%, the difference in the refractive index between the plurality of scattering portions 310 and the second layer 320 is very small or does not exist. Therefore, the vision recognition rate of the infrared camera with respect to the alignment mark M can be maximized, whereby the substrate 100 (or the lower substrate) and the opposing substrate 200 (or the upper substrate) of the display panel 10 can be accurately aligned. When the haze exceeds 90%, a screen blurring phenomenon can occur when a screen of the display panel 10 is driven, and it can be difficult to implement real black. Therefore, the optical member 30 according to one embodiment of the present disclosure can be provided so that the plurality of scattering portions 310 can have a haze of 0% or more and 90% or less, whereby alignment accuracy of the substrate 100 and the opposing substrate 200 can be improved in accordance with improvement of the vision recognition rate of the infrared camera, the screen blurring phenomenon may not occur when the screen of the display panel 10 is driven, and real black can be implemented.

More preferably, the optical member 30 according to one embodiment of the present disclosure can be provided so that the plurality of scattering portions 310 can have a haze of 20% or more and 70% or less. Since the difference in the refractive index between the plurality of scattering portions 310 and the second layer 320 is small when the haze of the plurality of scattering portions 310 is less than 20%, the radial rainbow pattern and the radial circular ring pattern of the reflective light can occur due to non-regularity or randomness of the diffraction pattern of the reflective light. That is, the effect of improving the rainbow pattern can be reduced. In addition, since the difference in the refractive index between the plurality of scattering portions 310 and the second layer 320 is large when the haze of the plurality of scattering portions 310 exceeds 70%, a sparkling phenomenon in which some dark portion and some bright portion exist can occur when the screen of the display panel 10 is driven, whereby visibility of an image can be deteriorated.

Therefore, the optical member 30 according to one embodiment of the present disclosure is provided so that the plurality of scattering portions 310 have a haze of 20% or more and 70% or less, whereby occurrence of a rainbow pattern and/or a ring pattern due to the reflective light can be suppressed or minimized, and occurrence of the sparkling phenomenon can be avoided.

Hereinafter, the display apparatus 1 according to one or more embodiments of the present disclosure will be described in detail with reference to FIGS. 10 and 11.

Figure 10:
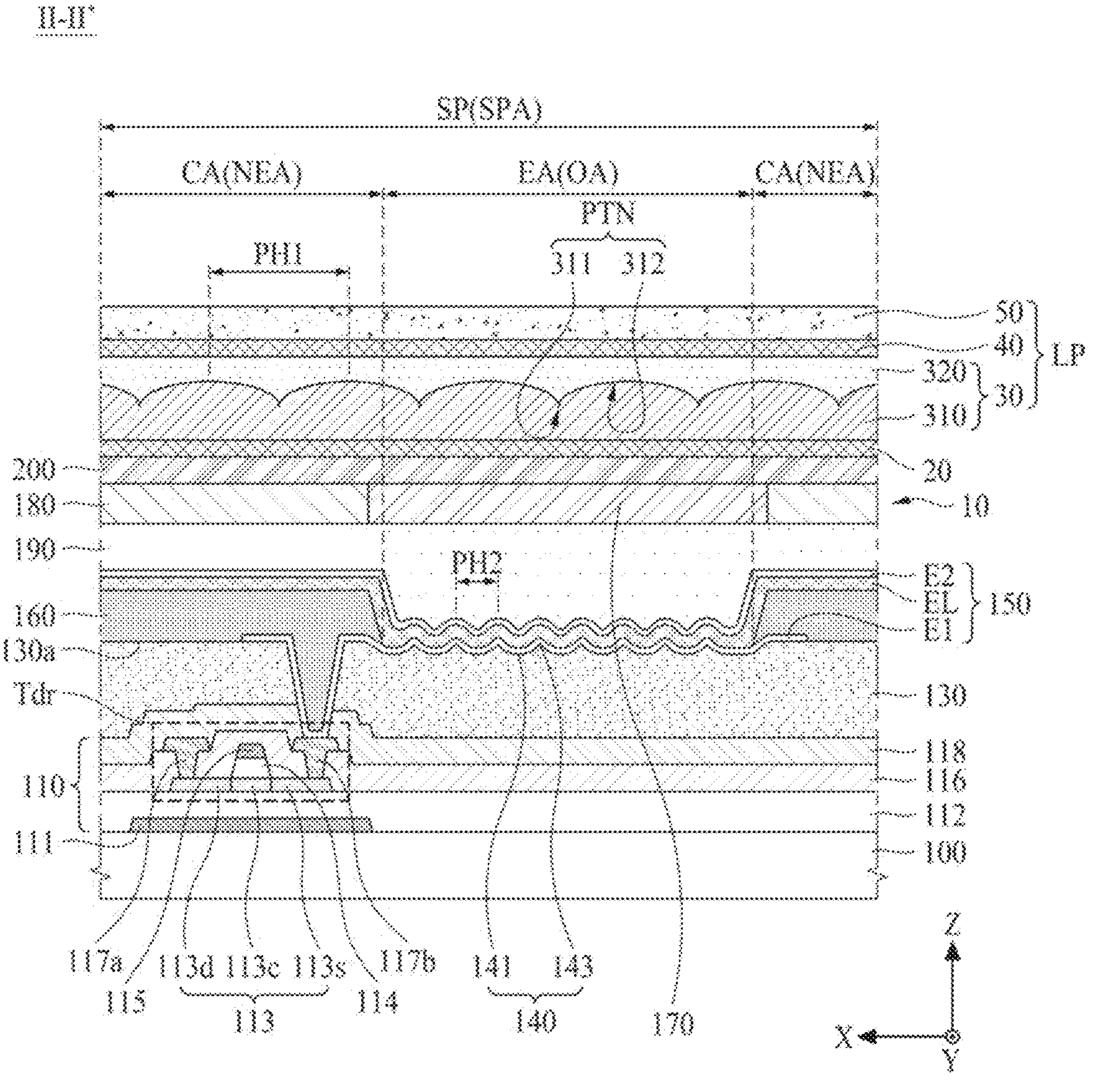
FIG. 10 is a schematic cross-sectional view of a display apparatus taken along line II-II' shown in FIG. 1 according to one embodiment of the present disclosure.

Particularly, FIG. 10 is a schematic cross-sectional view of the display apparatus 1 taken along line II-II' shown in FIG. 1, and illustrates one subpixel in the display apparatus 1 to which an optical panel LP having the optical member 30 is coupled on the display panel 10, according to one embodiment of the present disclosure.

Referring to FIG. 10, the display apparatus 1 according to one embodiment of the present disclosure can include a display panel 10 for displaying an image and an optical panel LP (shown in FIG. 6) coupled to the display panel 10. The optical panel LP can include the optical member 30. The optical panel LP according to one example can further include a polarizing plate 50.

The polarizing plate 50 according to one example can be disposed at a position, on which external light (or visible light) or infrared light is first incident, in the display apparatus 10. Therefore, as shown in FIG. 10, the polarizing plate 50 can be disposed on the second layer 320 of the optical member 30. The polarizing plate 50 according to one example can be coupled to the upper surface of the second layer 320 through an adhesive member 40. The polarizing plate 50 can transmit only a polarized component of any one direction of incident light and absorb or reflect the other components. Therefore, when the polarizing plate 50 is provided on the optical member 30, the decrease in intensity of the external light incident on the display panel 10 can be maximized. The optical panel LP can be coupled to the upper side of the display panel 10 or the lower side of the display panel 10.

Referring to FIG. 10, the display panel 10 can include a substrate 100 and an opposing substrate 200, which are bonded to each other. Since the above-described optical member 30 is disposed on the opposing substrate 200, the alignment mark (e.g., M, M') can be recognized by the infrared camera. Therefore, the opposing substrate 200 and the substrate 100 can be aligned based on the alignment mark recognized by the infrared camera, and thus can be bonded to each other without any alignment defect.

The substrate 100 can include or be a first substrate, a lower substrate, a transparent glass substrate or a transparent plastic substrate. The substrate 100 can include a display area AA and a non-display area IA.

The display area AA (e.g., shown in FIG. 6) is an area where an image is displayed, and can be a pixel array area, an active area, a pixel array unit, a display unit, or a screen. For example, the display area AA can be disposed at a central portion of the display panel 10. The display area AA can include a plurality of pixels P.

A plurality of pixels P (e.g., shown in FIG. 7) can be defined as unit areas in which light is actually emitted. Each of the plurality of pixels P can include a plurality of subpixels SP. According to one embodiment, each of the plurality of pixels P can include at least one red subpixel, at least one green subpixel, at least one blue subpixel, and at least one white subpixel, but is not limited thereto. For example, each of the plurality of pixels P can include a red subpixel, a green subpixel, a blue subpixel, and a white subpixel. Sizes of the plurality of subpixels included in each of the plurality of pixels P can be the same as or different from each other.

The non-display area IA (e.g., shown in FIG. 7) is an area on which an image is not displayed, and can be a peripheral area, a signal supply area, an inactive area or a bezel area. The non-display area IA can be configured to be in the vicinity of the display area AA. The display panel 10 or the substrate 100 can further include a peripheral circuit portion 120 disposed in a non-display area IA.

The peripheral circuit portion 120 can include a gate driving circuit connected to the plurality of pixels P. The gate driving circuit can be integrated in the non-display area IA at one side or both sides of the substrate 100 in accordance with a manufacturing process of the thin film transistor, and can be connected to the plurality of pixels P. For example, as shown in FIG. 7, the peripheral circuit portion 120 can be formed in the non-display area IA on both sides of the display area AA. The gate driving circuit according to one example can include a known shift register.

The opposite substrate 200 can encapsulate (or seal) the display area AA disposed on the substrate 100. For example, the opposite substrate 200 can be bonded to the substrate 100 via an adhesive member (or clear glue). The opposite substrate 200 can include or be an upper substrate, a second substrate, or an encapsulation substrate.

The optical panel LP (shown in FIG. 6) can be coupled to the display panel 10 of the display apparatus 1 according to one embodiment of the present disclosure to reduce the intensity (or reflectance) of light incident on the display panel 10, and can improve the vision recognition rate of the infrared camera with respect to the alignment mark (or tap bonding mark).

Referring back to FIG. 10, Each of the plurality of subpixels SP can be disposed in each of a plurality of subpixel areas SPA disposed in the pixel P (or pixel area). The subpixel area SPA according to one embodiment can include a circuit area CA and a light emission area EA. The circuit area CA can be spatially separated from the light emission area EA in the subpixel area SPA, but is not limited thereto. For example, at least a portion of the circuit area CA can overlap the light emission area EA in the subpixel area SPA or can be disposed below the light emission area EA. The light emission area EA can be an opening area OA, a light emitting area, a transmissive area, or a transmissive portion. For example, the circuit area CA can be a non-light emission area NEA or a non-opening area.

The display panel 10 according to one embodiment of the present disclosure can include a pixel circuit layer 110, an overcoat layer 130 and a light emitting element layer 150, which are disposed on the substrate 100.

The pixel circuit layer 110 can include a buffer layer 112, a pixel circuit, and a passivation layer 118.

The buffer layer 112 can be disposed on an entire first surface (or upper surface) of the substrate 100. The buffer layer 112 can serve to prevent materials contained in the substrate 100 from being diffused into a transistor layer or prevent external water or moisture from being permeated into the light emitting element layer 150 during a high temperature process of a manufacturing process of the thin film transistor. For example, the buffer layer 112 can be a first insulating layer, a first inorganic material layer or a lowermost insulating layer among a plurality of insulating layers disposed on the pixel circuit layer of the substrate 100.

The pixel circuit can include a driving thin film transistor Tdr disposed in the circuit area CA of each subpixel SP (or subpixel area SPA). The driving thin film transistor Tdr can include an active layer 113, a gate insulating layer 114, a gate electrode 115, an interlayer insulating layer 116, a drain electrode 117*a*, and a source electrode 117*b*.

The active layer 113 can be formed of a semiconductor material based on any one of amorphous silicon, polycrystalline silicon, oxide and organic material.

The gate insulating layer 114 can be formed on the channel area of the active layer 113. As an example, the gate insulating layer 114 can be formed in an island shape only on the channel area of the active layer 113, or can be formed on an entire front surface of the substrate 100 or the buffer layer 112, which includes the active layer 113. For example, when the gate insulating layer 114 is formed on the entire surface of the buffer layer 112, the gate insulating layer 114 can be a second insulating layer, a second inorganic material layer or a lowermost intermediate insulating layer among a plurality of insulating layers disposed on the pixel circuit layer of the substrate 100.

The gate electrode 115 can be disposed on the gate insulating layer 114 to overlap a channel area 113*c* of the active layer 113.

The interlayer insulating layer 116 can be formed on the gate electrode 115 and the drain area 113*d* and the source area 113*s* of the active layer 113. The interlayer insulating layer 116 can be formed on the substrate 100 or an entire surface of the buffer layer 112. For example, the interlayer insulating layer 116 can be a third insulating layer, a third inorganic material layer, or an upper insulating layer among a plurality of insulating layers disposed on the substrate 100.

The drain electrode 117*a* can be disposed on the interlayer insulating layer 116 so as to be electrically connected to the drain area 113*d* of the active layer 113. The source electrode

117*b* can be disposed on the interlayer insulating layer 116 so as to be electrically connected to the source area 113*s* of the active layer 113.

The pixel circuit can further include first and second switching thin film transistors and at least one capacitor, which are disposed in the circuit area CA together with the driving thin film transistor Tdr. The display panel according to the present disclosure can further include a light shielding layer 111 provided below the active layer 113 of at least one of the driving thin film transistor Tdr, the first switching thin film transistor or the second switching thin film transistor. The light shielding layer 111 can be configured to minimize or prevent a change in a threshold voltage of the thin film transistor due to external light.

The passivation layer 118 can be disposed over the substrate 100 to cover the pixel circuit. For example, the passivation layer 118 can be configured to cover the drain electrode 117*a*, the source electrode 117*b*, and the interlayer insulating layer 116 of the driving thin film transistor Tdr. For example, the passivation layer 118 can be made of an inorganic insulating material. For example, the passivation layer 118 can be a fourth insulating layer, a fourth inorganic material layer or an uppermost intermediate insulating layer among a plurality of insulating layers disposed on the pixel circuit layer of the substrate 100.

The overcoat layer 130 can be provided on the substrate 100 to cover the pixel circuit layer 110. The overcoat layer 130 can be formed in the other area except a pad area of the non-display area and the entire display area. For example, the overcoat layer 130 can include an extension portion (or an enlarged portion) extended or enlarged from the display area to the other non-display area except the pad area. Therefore, the overcoat layer 130 can have a size relatively wider than that of the display area.

The overcoat layer 130 according to one example can be formed to have a relatively thick thickness, thereby providing a flat surface on the pixel circuit layer 110. For example, the overcoat layer 130 can be made of an organic material such as photo acryl, benzocyclobutene, polyimide and fluorine resin. For example, the overcoat layer 130 can be a fifth insulating layer, an organic material layer, an uppermost insulating layer or a planarization layer among a plurality of insulating layers disposed on the substrate 100.

The overcoat layer 130 can include a light extraction portion 140 disposed in each subpixel SP. The light extraction portion 140 can be formed on an upper surface 130*a* of the overcoat layer 130 to overlap the light emission area EA of the subpixel area SPA. Therefore, the light extraction portion 140 can overlap (or be overlapped by) at least one of the plurality of concave portions 311 or the plurality of convex portions 312, which are included in the optical member 30.

The light extraction portion 140 can be formed on the overcoat layer 130 of the light emission area EA to have a curved (or uneven) shape, thereby changing a propagation path of light emitted from the light emitting element layer 150 to increase light extraction efficiency. For example, the light extraction portion 140 can be a non-flat portion, an uneven pattern portion, a micro lens portion, or a light scattering pattern portion.

The light extraction portion 140 can include a plurality of concave patterns 141 and a convex pattern 143 disposed near each of the plurality of concave patterns 141. The plurality of concave patterns 141 can be concavely formed or configured from the upper surface 130*a* of the overcoat layer 130. The convex pattern 143 can be disposed between the plurality of concave patterns 141. The convex pattern 143 can be formed to surround each of the plurality of concave patterns 141.

An upper portion of the convex pattern 143 can have a convex curved shape to increase light extraction efficiency, but is not limited thereto. For example, the upper portion of the convex pattern 143 can include a pointed tip structure. For example, the upper portion of the convex pattern 143 can include a convex cross-sectional dome or bell structure, but is not limited thereto.

The convex pattern 143 can include an inclined portion having a curved shape between a bottom portion and an upper portion (or a top portion). The inclined portion of the convex pattern 143 can form or configure the concave pattern 141. For example, the inclined portion of the convex pattern 143 can be an inclined surface or a curved portion. The inclined portion of the convex pattern 143 according to one embodiment can have a cross-sectional structure of a Gaussian curve. In this case, the inclined portion of the convex pattern 143 can have a tangent slope that is gradually increased from the bottom portion to the upper portion and gradually reduced.

The light emitting element layer 150 can be disposed on the light extraction portion 140 that overlaps the light emission area EA. The light emitting element layer 150 can be configured to emit light toward an opposing substrate 200 in accordance with a top emission type, but the embodiment of the present disclosure is not limited thereto. The light emitting element layer 150 according to one embodiment can include a first electrode E1, a light emitting layer EL and a second electrode E2.

The first electrode E1 can be formed on the overcoat layer 130 of the subpixel area SPA and electrically connected to the source electrode 117*b* (or the drain electrode 117*a*) of the driving thin film transistor Tdr. One end of the first electrode E1 adjacent to the circuit area CA can be electrically connected to the source electrode 117*b* (or the drain electrode 117*a*) of the driving thin film transistor Tdr through an electrode contact hole provided in the overcoat layer 130 and the passivation layer 118.

Since the first electrode E1 is directly in contact with the light extraction portion 140, the first electrode E1 has a shape that follows a shape of the light extraction portion 140. Since the first electrode E1 is formed (or deposited) on the overcoat layer 130 to have a relatively thin thickness, the first electrode E1 has a surface shape that conforms to a surface morphology of the light extraction portion 140 that includes the convex pattern 143 and the plurality of concave portions 141. For example, the first electrode E1 can have the same cross-sectional structure as that of the light extraction portion 140 as the first electrode E1 is formed in a conformal shape, which follows the surface shape (or morphology) of the light extraction portion 140, by a deposition process of a transparent conductive material.

The light emitting layer EL can be formed on the first electrode E1 and thus can be directly in contact with the first electrode E1. The light emitting layer EL can be formed (or deposited) on the first electrode E1 so as to have a relatively thick thickness as compared with the first electrode E1, thereby having a surface shape different from that of each of the plurality of concave portions 141 and the convex pattern 143 or that of the first electrode E1. For example, the light emitting layer EL can be formed in a non-conformal shape, which does not follow the surface shape (or morphology) of the first electrode E1, by a deposition process and thus can have a cross-sectional structure different from that of the first electrode E1.

The light emitting layer EL according to one embodiment can have a thickness that is gradually increased toward the bottom surface of the concave pattern 141. For example, the light emitting layer EL can be formed on the top of the convex pattern 143 to have a first thickness, can be formed on the bottom surface of the concave pattern 141 to have a second thickness thicker than the first thickness, and can be formed on the inclined surface (or the curved portion) of the convex pattern 143 to have a third thickness thinner than the first thickness. Each of the first to third thicknesses can correspond to a shortest distance between the first electrode E1 and the second electrode E2. However, it is not limited thereto, and the thickness of the light emitting layer EL can vary according to the shapes of the plurality of concave patterns 141 and the plurality of convex patterns 143.

The light emitting layer EL according to one embodiment can include two or more organic light emitting layers for emitting white light. For example, the light emitting layer EL can include first and second organic light emitting layers for emitting white light by mixing first light with second light. For example, the first light emitting layer can include any one of a blue organic light emitting layer, a green organic light emitting layer, a red organic light emitting layer, a yellow organic light emitting layer and a yellow-green organic light emitting layer to emit the first light. For example, the second organic light emitting layer can include an organic light emitting layer for emitting the second light for implementing white light by mixture with the first light of the blue organic light emitting layer, the green organic light emitting layer, the red organic light emitting layer, the yellow organic light emitting layer and the yellow-green organic light emitting layer. The light emitting layer EL according to another embodiment can include any one of the blue organic light emitting layer, the green organic light emitting layer and the red organic light emitting layer. Additionally, the light emitting layer EL can include a charge generation layer interposed between the first organic light emitting layer and the second organic light emitting layer.

The second electrode E2 can be formed on the light emitting layer EL and thus can be directly in contact with the light emitting layer EL. The second electrode E2 can be formed (or deposited) on the light emitting layer EL to have a relatively thin thickness as compared with the light emitting layer EL. The second electrode E2 can be formed (or deposited) on the light emitting layer EL to have a relatively thin thickness, thereby having a surface shape that conforms to that of the light emitting layer EL. For example, the second electrode E2 can be formed in a conformal shape that conforms to the surface shape (or morphology) of the light emitting layer EL by a deposition process to have a cross-sectional structure the same as that of the light emitting layer EL and different from that of the light extraction portion 140.

The second electrode E2 according to one embodiment can include a metal material having a low reflectance or a transflective metal to emit incident light, which is emitted from the light emitting layer EL, toward the opposing substrate 200, but is not limited thereto. When the display panel 10 of the present disclosure is implemented in a bottom emission type, the second electrode E2 can include a metal material having high reflectance to reflect light toward the substrate 100. For example, the second electrode E2 can include a single layered structure or multi-layered structure made of any one material selected from aluminum (Al), silver (Ag), molybdenum (Mo), gold (Au), magnesium (Mg), calcium (Ca) and barium (Ba), or two or more alloy materials. When the display panel 10 of the present specification is implemented in a bottom emission type, the second electrode E2 can include an opaque conductive material having high reflectivity. For example, the second electrode E2 can be a reflective electrode, a cathode electrode, a light-reflective surface, or a light-reflector, and in this case, the first electrode E1 can be an anode electrode or a transparent electrode.

The light emitting element layer 150 can emit light by a current supplied by the pixel circuit. The concave pattern 141 or the convex pattern 143 of the light extraction portion 140 increases external extraction efficiency of the light emitted from the light emitting layer EL by changing a path of the light emitted from the light emitting layer EL to the opposing substrate 200. For example, the convex pattern 143 prevents or minimizes degradation of light extraction efficiency due to light trapped in the light emitting element layer 150 by repeating total reflection between the first electrode E1 and the second electrode E2 of the light emitting element layer 150 without moving the light emitted from the light emitting element layer 150 to the opposing substrate 200. Therefore, the display apparatus 1 according to one embodiment of the present disclosure can improve light extraction efficiency of the light emitted from the light emitting element layer 150.

In the display apparatus 1 according to one embodiment of the present disclosure, since light extraction efficiency can be improved through the light extraction portion 140, the display apparatus 1 can have the same light emission efficiency or higher light emission efficiency even with low power as compared with the display apparatus having no light extraction portion, whereby overall power consumption can be reduced.

The display panel 10 according to one embodiment of the present disclosure can further include a bank layer 160. The bank layer 160 can be provided on an edge of the first electrode E1 and the overcoat layer 130. The bank layer 160 can be formed of an organic material such as a benzocyclobutene (BCB)-based resin, an acryl-based resin or a polyimide resin.

The bank layer 160 can be provided on the upper surface 130*a* of the overcoat layer 130 to cover the edge of the first electrode E1 extended onto the circuit area CA. The light emission area EA defined by the bank layer 160 can have a size smaller than that of the light extraction portion 140 of the overcoat layer 130 in a plan view.

The light emitting layer EL of the light emitting element layer 150 can be formed on the first electrode E1, the bank layer 160, and a step difference portion between the first electrode E1 and the bank layer 160. In this case, when the light emitting layer EL is formed in the step difference portion between the first electrode E1 and the bank layer 160 to have a relatively thin thickness, the second electrode E2 can be in electrical contact (or short) with the first electrode E1. To address this issue, an end (or outermost bank line) of the bank layer 160 adjacent to the light emission area EA can be disposed to cover an edge portion of the light extraction portion 140. Therefore, an electrical contact (or short) between the first electrode E1 and the second electrode E2 can be prevented from occurring due to an end of the bank layer 160 disposed in the step difference portion between the first electrode E1 and the bank layer 160.

The display panel 10 according to the present disclosure can further include a color filter layer 170.

The color filter layer 170 is for color conversion of light emitted from the light emitting element layer 150. When the display apparatus of the present disclosure is implemented in a top emission type, the color filter layer 170 according to one embodiment can be disposed between the opposing substrate 200 and the light emitting element layer 150 to overlap at least one light emission area EA. When the display apparatus of the present disclosure is implemented in a bottom emission type, the color filter layer 170 according to another embodiment can be disposed between the passivation layer 118 and the overcoat layer 130 to overlap the light emission area EA. The color filter layer 170 according to another embodiment can be disposed between the interlayer insulating layer 116 and the passivation layer 118 or between the substrate 100 and the interlayer insulating layer 116 to overlap the light emission area EA.

When the display panel 10 according to the present disclosure is coupled to the optical member 30, the color filter layer 170 can be disposed between the light emitting element layer 150 and the optical member 30. Therefore, the color filter layer 170 can color-convert light emitted from the light emitting element layer 150 and directed toward the optical member 30.

The color filter layer 170 can have a size larger than that of the light emission area EA. For example, the color filter layer 170 can have a size larger than that of the light emission area EA and smaller than that of the light extraction portion 140 of the overcoat layer 130, but is not limited thereto. The color filter layer 170 can have a size larger than that of the light extraction portion 140. For example, when the color filter layer 170 has a size larger than that of the light extraction portion 140, light leakage, in which internal light moves toward the subpixel SP adjacent thereto, can be reduced or minimized.

The color filter layer 170 according to one embodiment can include a color filter that transmits only a wavelength of a color, which is set in the subpixel SP among light emitted (or extracted) from the light emitting element layer 150 to the opposing substrate 200. For example, the color filter layer 170 can transmit a red, green or blue wavelength. When one pixel P includes first to fourth subpixels SP adjacent to one another, a color filter layer provided in the first subpixel can include a red color filter, a color filter layer provided in the second subpixel can include a green color filter, and a color filter layer provided in the third subpixel can include a blue color filter. The fourth subpixel may not include a color filter layer, or can include a transparent material for compensation of a step difference, thereby emitting white light.

The display panel 10 according to one embodiment of the present disclosure can include a black matrix 180.

The black matrix 180 can be formed in the non-emission area NEA adjacent to the light emission area EA. The black matrix 180 according to one example can be formed on the bank layer 160 to be adjacent to the color filter layer 170. For example, the black matrix 180 can surround the light emission area EA. The black matrix 180 can prevent light emitted from the subpixel SP for emitting light from being emitted toward an adjacent subpixel SP. Therefore, color mixture can be prevented from occurring between the subpixel SP for emitting light and the adjacent subpixel SP.

The display panel 10 according to one embodiment of the present disclosure can include an encapsulation portion 190.

The encapsulation portion 190 can be formed on the substrate 100 to cover the light emitting element layer 150. The encapsulation portion 190 can be provided on the substrate 100 to cover the second electrode E2. For example, the encapsulation portion 190 can surround the display area. The encapsulation portion 190 can serve to protect the thin film transistor and the light emitting layer EL from external impact and prevent oxygen and/or moisture or particles from being permeated into the light emitting layer EL.

The encapsulation portion 190 according to one embodiment can include one or more of inorganic encapsulation layers. The encapsulation portion 190 can further include at least one organic encapsulation layer interposed between the plurality of inorganic encapsulation layers. The organic encapsulation layer can be expressed as a particle cover layer.

The encapsulation portion 190 according to another embodiment can be changed to a filler fully surrounding the display area, and in this case, the opposing substrate 200 can be bonded to the substrate 100 via the filler. The filler can include a getter material that absorbs oxygen and/or moisture.

Optionally, when the encapsulation portion 190 is changed to a filler, the opposing substrate 200 can be coupled to the filler, and in this case, the opposing substrate 200 can be made of a plastic material, a glass material, or a metal material.

The optical panel LP can be coupled onto the opposing substrate 200. The optical panel LP can be coupled to the opposing substrate 200 through an adhesive 20. The adhesive 20 can be made of a transparent adhesive material having high light transmittance to enhance visibility of light emitted from the light emitting element layer 150. For example, the adhesive 20 can include at least one of PSA or OCA.

Meanwhile, the opposing substrate 200 can be aligned with the substrate 100 by marking an alignment mark M and/or a sub-alignment mark M', which is provided in the non-display area IA, thereby being bonded to the substrate 100 without any alignment defect. In detail, after the thin film transistor, the insulating layer and the light emitting element layer 150, which are described above, are formed on the substrate 100, and a color filter layer 170 and a black matrix 180 are formed on the opposing substrate 200, the substrate 100 and the opposing substrate 200 can be aligned and bonded to each other through the alignment mark M and/or the sub-alignment mark M'.

However, in this case, in order to reduce intensity (or reflectance) of the external light, when an optical member provided with a first layer and a second layer, which have a large difference in the refractive index but a constant or same refractive index not varying depending on wavelengths, is disposed on the opposing substrate, the recognition rate of the alignment mark can be lowered which may cause an alignment defect issue.

In order to address this issue, the display apparatus 1 according to one embodiment of the present disclosure can be provided so that at least one of the first layer 310 having the pattern portion PTN or the second layer 320 has a refractive index changed depending on the wavelengths and the difference in the refractive index between the first layer 310 and the second layer 320 can be greater in the visible ray area than the infrared area. Therefore, in the display apparatus 1 according to one embodiment of the present disclosure, since the difference in the refractive index between the first layer 310 and the second layer 320 is increased when the visible ray passes, occurrence of the rainbow pattern and the radial circular ring pattern can be suppressed or minimized. As a result, the display apparatus 1 according to one embodiment of the present disclosure can implement real black visibility in a non-driving or off state.

Further, in the display apparatus 1 according to one embodiment of the present disclosure, since the difference in the refractive index between the first layer 310 and the second layer 320 is small or does not exist when the infrared ray passes, the vision recognition rate of the infrared camera with respect to the alignment mark M and/or the sub-alignment mark M' can be improved, whereby an assembly defect of the substrate 100 (or the lower substrate) and the opposing substrate 200 (or the upper substrate) of the display panel 10 can be reduced.

Referring back to FIG. 10, in the display apparatus 1 according to one embodiment of the present disclosure, one convex portion 312 among the plurality of convex portions 312 can overlap several convex patterns 143 of a plurality of convex patterns 143. For example, the display apparatus 1 according to one embodiment of the present disclosure can be provided so that a pitch PH1 of the plurality of convex portions 312 is greater than a pitch PH2 of the plurality of convex patterns 143. Therefore, the number of the light extraction portions 140 (or a plurality of concave patterns 141 and the plurality of convex patterns 143) can be greater than the number of the pattern portions PTN (or the plurality of concave portions 311 and the plurality of convex portions 312) based on the light emission area EA. Therefore, in the display apparatus 1 according to one embodiment of the present disclosure of FIG. 10, the shape of the pattern portion PTN (or the plurality of concave portions 311 and the plurality of convex portions 312) can be easily formed without any defect as compared with the case that the pitch of the plurality of convex patterns 143 is greater than that of the plurality of convex portions 312.

Figure 11:
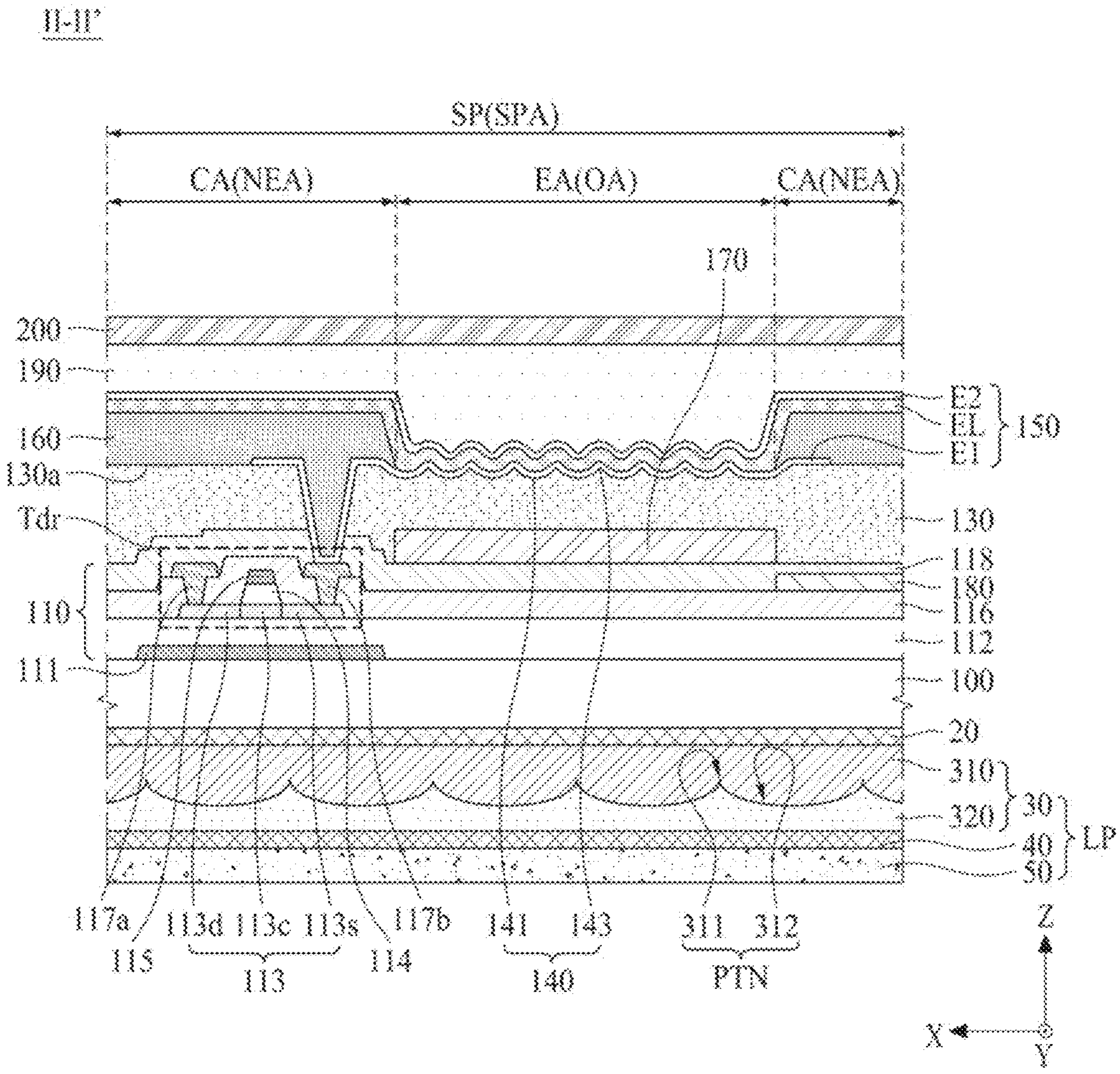
FIG. 11 is a schematic cross-sectional view of a display apparatus taken along line II-II' shown in FIG. 1 according to another embodiment of the present disclosure.

FIG. 11 is a schematic circuit view illustrating a display apparatus according to another embodiment of the present disclosure.

Referring to FIG. 11, the display apparatus 1 according to another embodiment of the present disclosure is the same as the display apparatus of FIG. 10 except that the display panel 10 is changed to be a bottom emission type and the optical member 30 (or the optical panel LP) is coupled to the lower side of the display panel 10. Therefore, the same reference numerals will be given to the same elements as those of FIG. 10, and the following description will be based on differences from FIG. 10.

In case of the display apparatus according to FIG. 10 described above, the optical panel LP (or the optical member 30 including the first layer 310 and the second layer 320) can be coupled onto the upper surface of the display panel 10 so that the intensity of the external light EXL can be reduced by diffracting or scattering light when the visible ray passes, whereby the rainbow pattern and/or the circular ring pattern may not occur, and since light is not refracted when infrared ray passes, the recognition rate of the alignment mark or the tab bonding mark can be improved so that the alignment defect can be reduced.

Similarly, in case of the display apparatus according to FIG. 11, the display panel 10 is implemented as a bottom emission type. Therefore, the optical member 30 (or the optical panel LP) can be coupled to the direction in which light is emitted from the display panel 10, for example, the lower side of the display panel 10 through the adhesive 20.

Since the display apparatus 1 according to FIG. 11 is the bottom emission type, the color filter layer 170 can be disposed between the overcoat layer 130 and the passivation layer 118. Therefore, the color filter layer 170 can color-convert light emitted from the light emitting element layer 150 and directed toward the lower surface of the substrate 100. In addition, since the display apparatus 1 according to FIG. 11 is the bottom emission type, the black matrix 180 can be disposed between the passivation layer 118 and the interlayer insulating layer 116 without overlapping the color filter layer 170. Therefore, the black matrix 180 can be disposed between adjacent subpixels SP to prevent color mixture from occurring, but is not limited thereto. The black matrix 180 can be disposed on the same layer as the color filter layer 170 as far as it can prevent color mixture from occurring.

Meanwhile, since the display apparatus 1 according to FIG. 11 is the bottom emission type, the second electrode E2 can be provided as a reflective electrode, and the first electrode E1 can be provided as a translucent electrode or a transparent electrode.

In case of the display apparatus according to FIG. 11, since the external light is incident through the lower side of the display panel 10, the stacking order of the optical panel LP can be disposed in the reverse order of the optical panel of the display apparatus of FIG. 10. As shown in FIG. 11, the first layer 310 of the optical member 30 can be coupled to the lower surface of the substrate 100 through the adhesive 20. The second layer 320 having a refractive index different from that of the first layer 310 can be disposed below the first layer 310, and the polarizing plate 50 can be coupled to a lower portion of the second layer 320 through the adhesive member 40.

Therefore, in case of the display apparatus according to FIG. 11, the recognition rate of the infrared camera with respect to the alignment mark M and/or the sub-alignment mark M' provided in the non-display area IA of the display panel 10 can be improved due to the optical member 30 (or the optical panel LP) disposed below the display panel 10. Therefore, the display apparatus 1 according to FIG. 11 can improve the recognition rate of the alignment mark M and/or the sub-alignment mark M', thereby reducing the alignment defect. In addition, even though the optical member 30 is provided on the lower surface of the display panel 10, the display apparatus 1 according to FIG. 11 can improve the recognition rate of the infrared camera with respect to the tab bonding mark, thereby reducing the pixel driving defect due to improved assembly of the printed circuit board PCB and the tab.

Further, in case of the display apparatus according to FIG. 11, when the optical member 30 (or the optical panel LP) disposed below the display panel 10 can reduce reflectance of the external light and the intensity of the external light when the visible ray is incident on the lower surface of the display area AA. Therefore, the display apparatus 1 according to FIG. 11 can suppress or minimize the diffraction pattern of the reflective light generated from the light extraction portion 140, or can suppress or minimize occurrence of the radial rainbow pattern and the radial circular ring pattern of the reflective light due to non-regularity or randomness of the diffraction pattern of the reflective light.

Further, the display apparatus 1 according to FIG. 11 can suppress or minimize occurrence of the radial rainbow pattern and the radial circular ring pattern due to the external light due to the optical member 30 (or the optical panel LP) coupled to the lower side of the display panel 10, thereby implementing real black visibility in a non-driving or off state.

According to the present disclosure, the following advantageous effects can be obtained, but other advantages are provided.

The optical member according to the present disclosure has a refractive index varied depending on a wavelength area of at least one of the first layer or the second layer, and the difference in the refractive index between the first layer and the second layer is greater in the visible ray area than the infrared area, whereby reflectance of the external light in the visible ray area can be reduced, and the vision recognition rate of the alignment mark used for various alignments in the infrared area can be improved.

The display apparatus according to the present disclosure includes the optical member having an improved vision recognition rate in the infrared area, so that the alignment defect of the lower substrate and the upper substrate can be reduced.

The display apparatus according to the present disclosure can include the optical member having an improved vision recognition rate in the infrared area, so that the repair process of the defective subpixel can be easily performed.

The optical member according to the present disclosure can include the first layer including the pattern portion having the plurality of concave portions and the plurality of convex portions, and the second layer having a refractive index different from that of the first layer, so that the intensity of the external light passing through the first layer and the second layer can be reduced, whereby reflectance of the external light can be reduced.

In the display apparatus according to the present disclosure, each of the plurality of subpixels can include the light extraction portion that includes a plurality of concave patterns and a plurality of convex patterns, so that light extraction efficiency of the light emitted from the light emitting element layer can be improved.

The display apparatus according to the present disclosure can improve light extraction efficiency through the light extraction portion, and thus can have the same light emission efficiency as that of the display apparatus having no light extraction portion even with a low power, or can have more improved light emission efficiency than that of the display apparatus having no light extraction portion, whereby overall power consumption can be reduced.

The display apparatus according to the present disclosure can be provided with the optical member so that the intensity of the external light incident on the light extraction portion can be reduced by the optical member, whereby the diffraction pattern of the reflective light generated by the light extraction portion can be suppressed or minimized, or occurrence of the radial rainbow pattern and the radial circular ring pattern due to non-regularity or randomness of the diffraction pattern of the reflective light can be suppressed or minimized.

Further, in the display apparatus according to the present disclosure, since the external light can be subdivided by the optical member, occurrence of the radial rainbow pattern and the radial circular ring pattern due to the external light can be suppressed or minimized, whereby real black visibility in a non-driving or off state can be implemented.

It will be apparent to those skilled in the art that the present disclosure described above is not limited by the above-described embodiments and the accompanying drawings and that various substitutions, modifications and variations can be made in the present disclosure without departing from the spirit or scope of the disclosures. Consequently, the scope of the present disclosure is defined by the accompanying claims and it is intended that all variations or modifications derived from the meaning, scope and equivalent concept of the claims fall within the scope of the present disclosure.

What is claimed is:

1. A display apparatus comprising:

a display panel configured to display an image; and an optical panel coupled to an upper side or lower side of the display panel, wherein the optical panel includes an optical member, wherein the optical member includes:

a first layer including a pattern portion; and a second layer covering the pattern portion, wherein at least one of the first layer or the second layer has a refractive index varied depending on different wavelength areas, wherein the different wavelength areas include a visible ray area and an infrared area having a wavelength longer than a wavelength of the visible ray area, wherein a difference in a refractive index between the first layer and the second layer is greater in the visible ray area than the infrared area, wherein the display panel includes:

a substrate including a plurality of pixels having a plurality of subpixels; and an opposing substrate to face the substrate, wherein the opposing substrate includes an alignment mark in a non-display area, wherein the substrate includes a sub-alignment mark in the non-display area, and wherein the first layer and the second layer overlap the alignment mark and the sub-alignment mark.

2. The display apparatus of claim 1, wherein the pattern portion of the first layer includes a plurality of concave portions and a plurality of convex portions between the plurality of concave portions.

3. The display apparatus of claim 2, wherein the refractive index of the second layer is greater than the refractive index of the first layer, and wherein a change in the refractive index of the second layer from the visible ray area to the infrared area is greater than a change in the refractive index of the first layer from the visible ray area to the infrared area.

4. The display apparatus of claim 3, wherein the difference in the refractive index between the first layer and the second layer in the visible ray area is greater than 0.03 and is equal to or less than 0.4.

5. The display apparatus of claim 3, wherein the difference in the refractive index between the first layer and the second layer in the infrared area is in a range of 0 to 0.03.

6. The display apparatus of claim 3, wherein the second layer includes an acrylate based compound containing at least one of epoxy acrylate or fluorine epoxy acrylate, or a compound containing silicon (Si), titanium (Ti), sulfur(S), aluminum (Al), zinc (Zn), tantalum (Ta), magnesium (Mg), yttrium (Y), and/or hafnium (Hf).

7. The display apparatus of claim 3, wherein the first layer includes an acrylate-based compound containing at least one of silicon modified acrylate or urethane acrylate, or a compound containing zirconium (Zr), fluorine (F) and sodium (Na).

8. The display apparatus of claim 1, wherein the pattern portion of the first layer includes a plurality of scattering portions.

9. The display apparatus of claim 8, wherein the plurality of scattering portions have a refractive index greater than the refractive index of the second layer, and wherein a change in the refractive index of the plurality of scattering portions from the visible ray area to the infrared area is greater than a change in the refractive index of the second layer from the visible ray area to the infrared area.

10. The display apparatus of claim 9, wherein the plurality of scattering portions include a first material having at least one of silicon oxide ($SiO_2$), titanium oxide ($TiO_2$), silicon nitride (SixNy), silicon oxide nitride (SiON), aluminum oxide (AlOx), aluminum nitride (AlON), zinc oxide (ZnO), tantalum pentoxide ($Ta_2O_5$), magnesium fluoride ($MgF_2$), yttrium oxide ($Y_2O_3$) or hafnium oxide ($HfO_2$), and/or a polymethyl methacrylate (PMMA), polycarbonate (PC), polyethylene terephthalate (PET), polyurethane (PU), polystyrene (PS) and nylon-based material to which the first material is added.

11. The display apparatus of claim 9, wherein the second layer includes an acrylate-based compound that includes at least one of silicone-modified acrylate or urethane acrylate, or a compound containing zirconium (Zr), fluorine (F) and sodium (Na).

12. The display apparatus of claim 8, wherein the refractive index of the second layer is greater than the refractive index of the plurality of scattering portions, and wherein a change in the refractive index of the second layer from the visible ray area to the infrared area is greater than a change in the refractive index of the plurality of scattering portions from the visible ray area to the infrared area.

13. The display apparatus of claim 12, wherein the second layer includes an acrylate based compound containing at least one of epoxy acrylate, fluorine epoxy acrylate, silicon modified acrylate or urethane acrylate, or a compound containing silicon (Si), titanium (Ti), sulfur(S), aluminum (Al), zinc (Zn), tantalum (Ta), magnesium (Mg), yttrium (Y), and/or hafnium (Hf).

14. The display apparatus of claim 12, wherein the plurality of scattering portions include a second material that includes at least one of polymethyl methacrylate (PMMA), polycarbonate (PC), polyethylene terephthalate (PET), or sodium hexafluoroaluminate ($Na_3AlF_6$), and/or a polyurethane (PU), polystyrene (PS) and nylon-based material to which the second material is added.

15. The display apparatus of claim 8, wherein the plurality of scattering portions have a haze that is in a rage of 0% to 90%.

16. The display apparatus of claim 1, wherein the display panel further includes:

a light extraction portion disposed on the substrate and in each of the plurality of subpixels, and wherein in each of the plurality of subpixels, the light extraction portion overlaps at least one of a plurality of concave portions and a plurality of convex portions included in the pattern portion of the first layer in the optical member.

17. The display apparatus of claim 16, wherein the display panel further includes:

a light emitting element layer on the light extraction portion; and a color filter layer configured to color-convert light emitted from the light emitting element layer, and wherein the color filter layer is between the light emitting element layer and the optical member.

18. The display apparatus of claim 16, wherein the light extraction portion includes a plurality of concave patterns and a plurality of convex patterns between the concave patterns, and wherein a pitch of the plurality of convex portions of the first layer in the optical member is greater than a pitch of the plurality of convex patterns of the light extraction portion, or one of the plurality of convex portions overlaps several of the plurality of convex patterns.

* * * * *